(12) United States Patent
Wang et al.

(10) Patent No.: US 11,854,928 B2
(45) Date of Patent: Dec. 26, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chuei-Tang Wang, Taichung (TW); Tzu-Chun Tang, Kaohsiung (TW); Wei-Ting Chen, Tainan (TW); Chung-Hao Tsai, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/458,576

(22) Filed: Aug. 27, 2021

(65) Prior Publication Data

US 2023/0062136 A1 Mar. 2, 2023

(51) Int. Cl.
*H01L 23/528* (2006.01)
*H01L 23/31* (2006.01)
*H01L 29/66* (2006.01)
*H01L 23/00* (2006.01)
*H01L 29/94* (2006.01)

(52) U.S. Cl.
CPC ...... *H01L 23/3185* (2013.01); *H01L 23/3171* (2013.01); *H01L 23/5283* (2013.01); *H01L 24/13* (2013.01); *H01L 29/66181* (2013.01); *H01L 29/945* (2013.01); *H01L 2224/13008* (2013.01)

(58) Field of Classification Search
CPC .......................... H01L 23/3185; H01L 29/945
See application file for complete search history.

(56) References Cited

U.S. PATENT DOCUMENTS

| 8,629,042 | B2* | 1/2014 | Yang | H01L 25/0657 |
| | | | | 438/459 |
| 8,901,727 | B2* | 12/2014 | Kang | H01L 25/0657 |
| | | | | 257/E25.027 |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |

(Continued)

*Primary Examiner* — Eugene Lee
(74) *Attorney, Agent, or Firm* — JCIPRNET

(57) ABSTRACT

A semiconductor package includes an integrated circuit (IC) structure, an insulating encapsulation laterally covering the IC structure, and a redistribution structure disposed on the insulating encapsulation and the IC structure. The redistribution structure is electrically connected to the IC structure. The IC structure includes a first die, a capacitor structure, a dielectric layer laterally covering the first die and the capacitor structure, and a second die disposed on the dielectric layer, the first die, and the capacitor structure. The second die interacts with the capacitor structure, where a bonding interface between the second die and the first die is substantially coplanar with a bonding interface between the second die and the dielectric layer. A manufacturing method of a semiconductor package is also provided.

20 Claims, 26 Drawing Sheets

SP1

(56) References Cited

U.S. PATENT DOCUMENTS

| | | | |
|---|---|---|---|
| 9,478,474 B2* | 10/2016 | Chen | H01L 23/3128 |
| 9,496,189 B2 | 11/2016 | Yu et al. | |
| 9,666,502 B2 | 5/2017 | Chen et al. | |
| 9,735,131 B2 | 8/2017 | Su et al. | |
| 9,853,012 B2* | 12/2017 | Chung | H01L 24/97 |
| 10,008,479 B2* | 6/2018 | Hsiao | H01L 21/56 |
| 10,535,633 B2* | 1/2020 | Wei | H01L 25/18 |
| 10,756,010 B2* | 8/2020 | Yu | H01L 24/08 |
| 2014/0103488 A1* | 4/2014 | Chen | H01L 24/19 |
| | | | 257/532 |
| 2016/0095221 A1* | 3/2016 | Ramachandran | H01L 23/60 |
| | | | 361/783 |
| 2018/0006006 A1* | 1/2018 | Kim | H01L 24/33 |
| 2018/0286824 A1* | 10/2018 | Jeng | H01L 24/05 |
| 2019/0057949 A1* | 2/2019 | Hwang | H01L 21/6835 |
| 2019/0131277 A1* | 5/2019 | Yang | H01L 24/05 |
| 2020/0043896 A1* | 2/2020 | Yu | H01L 25/0657 |
| 2020/0402892 A1* | 12/2020 | Chen | H01L 23/5389 |
| 2021/0043557 A1* | 2/2021 | Lee | H01L 23/481 |
| 2021/0159224 A1* | 5/2021 | Shen | H01L 28/75 |

\* cited by examiner

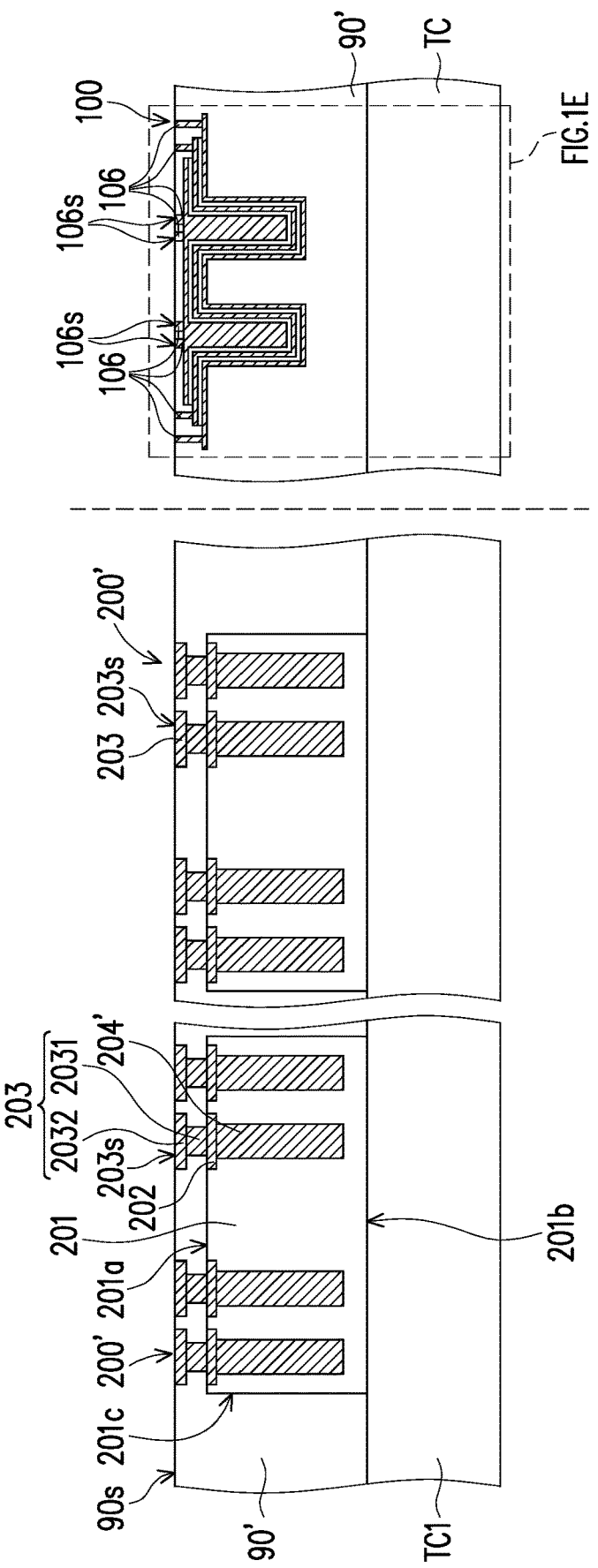

SEMICONDUCTOR PACKAGE AND MANUFACTURING METHOD THEREOF

BACKGROUND

As the demand for miniaturization, higher speed and greater bandwidth, as well as lower power consumption and latency has grown recently, there has grown a need for smaller and more creative packaging techniques of semiconductor dies. Currently, integrated fan-out packages are becoming increasingly popular for their compactness. For example, semiconductor dies are sawed from wafers and then packaged. An advantageous feature of this packaging technology is the possibility of forming integrated fan-out packages, which means the I/O pads on a semiconductor die may be redistributed to a greater area than the semiconductor die, and hence the number of I/O pads packed on the surfaces of the semiconductor dies may be increased. However, existing integrated fan-out packages and methods to make the same are not entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are schematic cross-sectional views of various stages of manufacturing a semiconductor package in accordance with some embodiments.

DETAILED DESCRIPTION

Figure 1B:
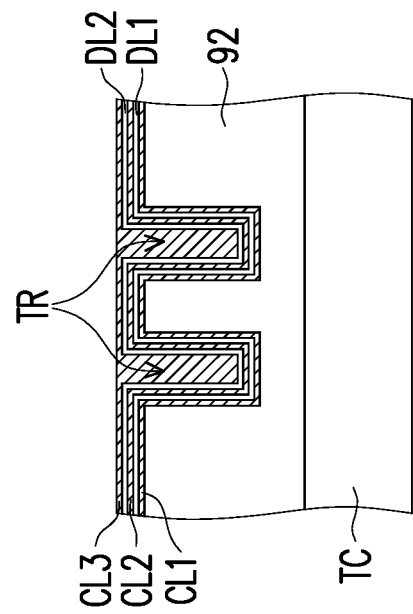
FIGS. 1A-1E are schematic cross-sectional views of various stages of manufacturing a capacitor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1A:
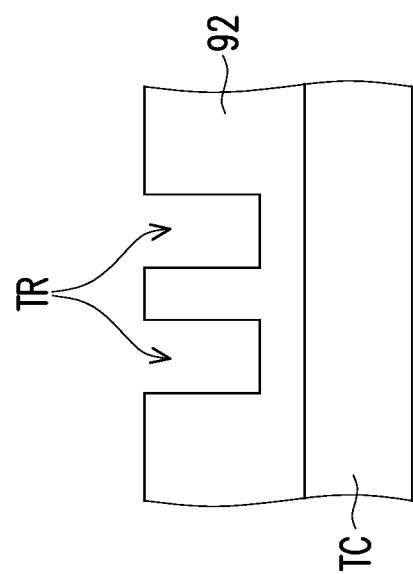

FIGS. 1A-1E are schematic cross-sectional views of various stages of manufacturing a capacitor structure in accordance with some embodiments. Referring to FIG. 1A, a dielectric sublayer 92 having trenches TR is formed over a temporary carrier TC. The temporary carrier TC may be made of a material such as glass, silicon, polymer composite, metal, ceramic, tape, and/or other suitable material for structural support. In some embodiments, the temporary carrier TC is provided with a release film (e.g., a light-to-heat-conversion (LTHC) coating film or the like; not shown), and the dielectric sublayer 92 is deposited on the release film. The release film may be easily detached from the temporary carrier TC in a subsequent de-bonding process.

In some embodiments, forming the dielectric sublayer 92 includes depositing a dielectric material by any acceptable deposition process (e.g., chemical vapor deposition (CVD), spin-coating, and/or the like) and forming the trenches TR in the dielectric material by any acceptable patterning process. For example, a photoresist is formed and patterned over the dielectric material, and one or more etching processes may be utilized to remove those portions of the dielectric material where the trenches TR are desired. Examples of suitable materials for the dielectric sublayer 92 include, but are not limited to, an oxide (e.g., silicon oxide), a nitride (e.g., silicon nitride), an oxynitride (e.g., SiON), a combination thereof, and/or the like. The trenches TR may be formed to have any desired shape and have any value of aspect ratio, depending on product requirements. For example, the trenches TR may be substantially circular, oval, square, or round in a top view (not shown).

Referring to FIG. 1B, conductive material layers (CL1, CL2, and CL3) and dielectric material layers (DL1 and DL2) are alternately formed over the dielectric sublayer 92 and inside the trenches TR. Examples of suitable materials for the conductive material layers (CL1, CL2, and CL3) include, but are not limited to, copper, tungsten, aluminum, tantalum, tantalum nitride, titanium, titanium nitride, metal alloys, or another conductive material. Examples of suitable materials for the dielectric material layers (DL1 and DL2) include, but are not limited to, a high dielectric constant (k) material (e.g., hafnium oxide, zirconium oxide, aluminum oxide, tantalum oxide, titanium oxide, a nitride, etc.), a polymeric material, combinations or multiple layers thereof, or any suitable capacitor dielectric material. The material(s) of the dielectric material layers (DL1 and DL2) may be different from that of the dielectric sublayer 92. For example, the dielectric constant of the dielectric material layers (DL1 and/or DL2) is greater than that of the dielectric sublayer 92.

In some embodiments, the conductive material layer CL1 is conformally formed on the dielectric sublayer 92 and lines the trenches TR. Next, the dielectric material layer DL1 may be conformally formed on the conductive material layer CL1, and then the conductive material layer CL2 and the dielectric material layer DL2 are sequentially formed on the dielectric material layer DL1 in a conformal manner. Subsequently, the conductive material layer CL3 may be formed on the dielectric material layer DL2 and may be deposited to fill a remaining portion of each trench TR. Alternatively, the conductive material layer CL3 is conformally formed on the dielectric material layer DL2 and a cavity (not shown) may be remained in the respective trench TR. A planarization process is optionally performed to remove excess conductive material.

Figure 1D:
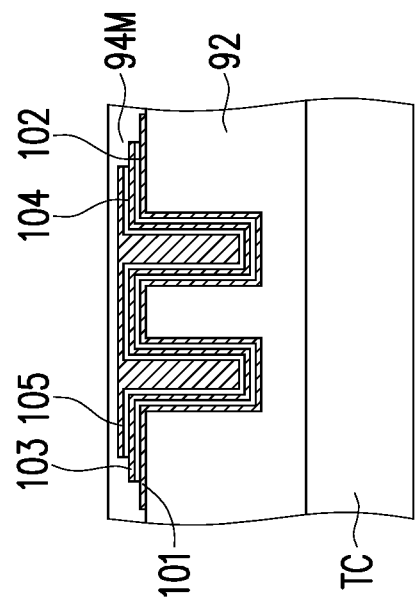
Figure 1C:
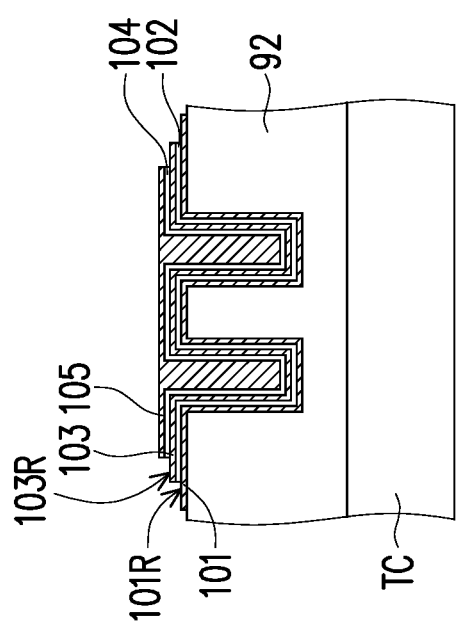

Referring to FIG. 1C and with reference to FIG. 1B, the conductive material layers (CL1, CL2, and CL3) and the dielectric material layers (DL1 and DL2) are subsequently patterned to form electrode layers (101, 103, and 105) and capacitor dielectric layers (102 and 104) by using lithography and etching and/or any suitable patterning process. It should be understood that five-layered structure is shown for illustrative purpose only, more than five layers may be possible to increase the capacitance of capacitor, or fewer layers may also be possible depending on product requirements.

In some embodiments, the uppermost electrode layer 105 has a sidewall substantially aligned with a sidewall of the underlying capacitor dielectric layer 104, and the sidewall of the electrode layer 103 is staggered with the overlying capacitor dielectric layer 104 but may be substantially aligned with the sidewall of the underlying capacitor dielectric layer 102. Alternatively, the sidewall of the uppermost electrode layer 105 may be staggered with the sidewall of the capacitor dielectric layer 104, and the sidewall of the electrode layer 103 may be staggered with the sidewall of the capacitor dielectric layer 102. In some embodiments, the electrode layer 103 underlying the capacitor dielectric layer 104 may have a top surface having a contact region 103R that is accessibly exposed by the overlying layers (e.g., the capacitor dielectric layer 104 and the uppermost electrode layer 105). The bottommost electrode layer 101 underlying the capacitor dielectric layer 102 may have a top surface having a contact region 101R that is accessibly exposed by the overlying layers (e.g., the capacitor dielectric layers 102 and 104 and the electrode layers 103 and 105).

Referring to FIG. 1D, a dielectric material 94M is formed over the dielectric sublayer 92 to cover the electrode layers (101, 103, and 105) and the capacitor dielectric layers (102 and 104). Examples of suitable materials for the dielectric material 94M include, but are not limited to, an oxide (e.g., silicon oxide), a nitride (e.g., silicon nitride), an oxynitride (e.g., SiON), a combination thereof, etc. In some embodiments, the material and/or the formation method of the dielectric material 94' may be the same as (or similar to) those of the dielectric sublayer 92.

Figure 1E:
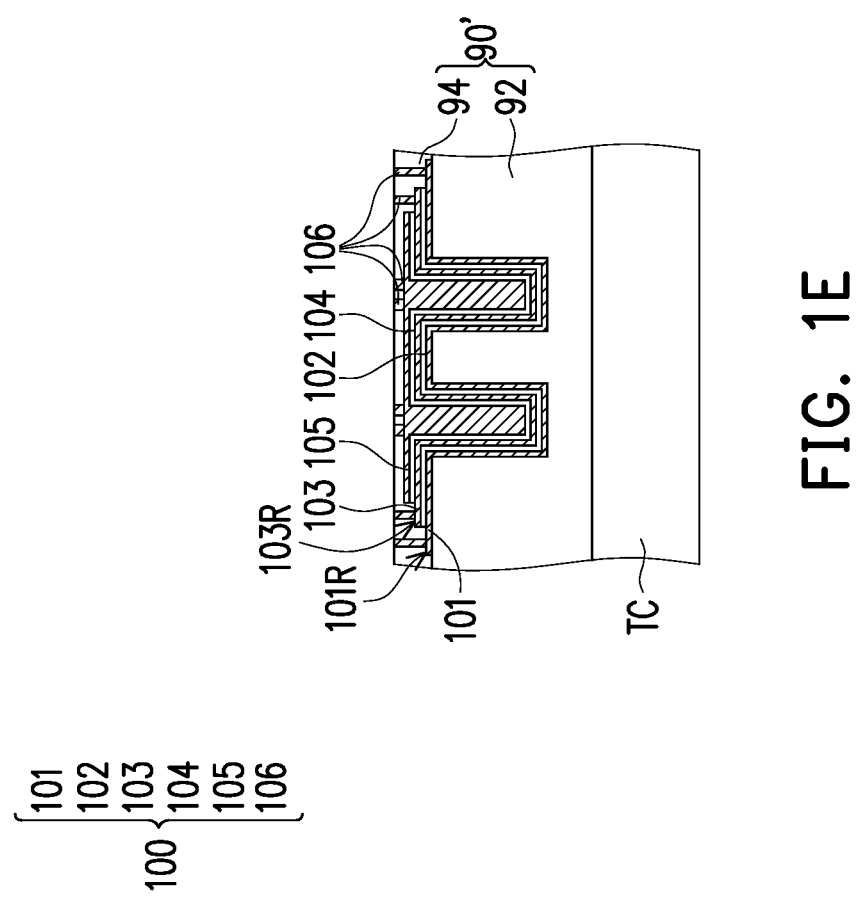

Referring to FIG. 1E and with reference to FIG. 1D, a plurality of electrode connectors 106 are formed on the electrode layers (101, 103, and 105) for further electrical connection. For example, portions of the dielectric material 94M are removed to form a dielectric sublayer 94 having openings. In some embodiments, a portion of the contact regions (101R and 103R) of the electrode layers (101 and 103) are accessibly exposed by the openings of the dielectric sublayer 94, and a portion of the uppermost electrode layer 105 may also be accessibly exposed by the openings of the dielectric sublayer 94. Subsequently, conductive materials may be formed inside the openings of the dielectric sublayer 94 to form the electrode connectors 106. Examples of suitable materials for the electrode connectors 106 include, but are not limited to, copper, tungsten, aluminum, tantalum, tantalum nitride, titanium, titanium nitride, metal alloys, or another conductive material.

In some embodiments, a portion of the electrode connectors 106 lands on the bottommost electrode layer 101, another portion of the electrode connectors 106 lands on the middle electrode layer 103, and the other portion of the electrode connectors 106 lands on the uppermost electrode layer 105. Since the electrode connectors 106 are connected to different levels of the electrode layers (101, 103, and 105), the electrode connectors 106 may have various vertical dimensions (e.g., height or thickness). For example, the portion of the electrode connectors 106 landing on the bottommost electrode layer 101 has the greatest vertical dimension, and the other portion of the electrode connectors 106 landing on the uppermost electrode layer 105 has the smallest vertical dimension. In some embodiments, a planarization process is performed so that top surfaces of the dielectric sublayer 94 and the electrode connectors 106 may be substantially leveled (e.g., coplanar) within process variations. Alternatively, the planarization is skipped.

In some embodiments, the capacitor structure 100 covered by the dielectric layer 90' may be referred to as a deep-trench capacitor. The aforementioned process is merely one method of forming the deep-trench capacitors, and other methods are also fully intended to be included within the scope of the embodiments. The capacitor structure 100 may be disposed in any integrated circuit (IC) component to reduce noise and stabilize power signals. It should be understood that the conventional capacitors often consume a relatively large area of an IC die to obtain a high capacitance, and thus some compromises between performance, power, and the manufacturing process must be made. The following embodiments include semiconductor packages that have the capacitor structure formed outside and bonded to a semiconductor die (or chip). Advantages of these embodiments include providing novel capacitor designs for semiconductor packages without limiting the performance, power, and manufacturing options that may be used to design smaller, faster, and more power efficient designs of dies.

FIGS. 2A-2G are schematic cross-sectional views of various stages of manufacturing a semiconductor package in accordance with some embodiments. It should be noted that the capacitor structure 100 described in the preceding paragraphs may be implementable in manufacturing process flows for semiconductor packages as will be described below. Like reference numbers indicate like elements to those discussed above with respect to FIGS. 1A-1E.

Referring to FIG. 2A, the capacitor structure 100 covered by the dielectric layer 90' is formed over the temporary carrier TC as described in FIGS. 1A-1E, so the detailed descriptions are not repeated for the sake of brevity. In some embodiments, at least one semiconductor die 200' is formed over a temporary carrier TC1, and a dielectric layer 90' is formed over the temporary carrier TC1 to cover the semiconductor dies 200'. The dielectric layer 90' that covers the semiconductor dies 200' may be the same (or similar)

dielectric material as the dielectric material that covers the capacitor structure 100. The temporary carrier TC1 may be similar to the temporary carrier TC. For example, a plurality of the semiconductor dies 200' is arranged in an array over the temporary carrier TC1. In some embodiments, the capacitor structure 100 and the semiconductor dies 200' are separately fabricated as indicated by the dashed line. It is noted that the number of the semiconductor dies and the number of the capacitor structure shown herein are merely an example and may vary depending on product and/or process requirements.

The respective semiconductor die 200' may be or may include a logic die (e.g., central processing unit (CPU), graphics processing unit (GPU), system-on-a-chip (SoC), application processor, microcontroller, etc.), a memory die (e.g., dynamic random access memory (DRAM) die, static random access memory (SRAM) die, etc.), a power management die, a radio frequency die, a sensor die, a micro-electro-mechanical-system (MEMS) die, a signal processing die, the like, or combinations thereof. The respective semiconductor die 200' may be formed in a semiconductor wafer, which may include different die regions that are singulated in subsequent steps to form a plurality of semiconductor dies. The respective semiconductor die 200' may be processed according to applicable manufacturing processes to form integrated circuits.

The respective semiconductor die 200' may include a semiconductor substrate 201 (e.g., a silicon substrate, a semiconductor-on-insulator (SOI) substrate, a multi-layered substrate, a gradient substrate, and/or the like). The material of the semiconductor substrate 201 may include any suitable semiconductor material, such as silicon, germanium, a compound semiconductor (e.g., silicon carbide, gallium arsenic, gallium phosphide, indium phosphide, indium arsenide, and/or indium antimonide), an alloy semiconductor (e.g., SiGe, GaAsP, AlInAs, AlGaAs, GaInAs, GaInP, and/or GaInAsP), or combinations thereof, etc. For example, the semiconductor substrate 201 has a first surface 201a, a second surface 201b opposite to the first surface 201a, and a sidewall 201c connected to the first surface 201a and the second surface 201b. The semiconductor substrate 201 may (or may not) include semiconductor devices (e.g., transistors, diodes, capacitors, resistors, inductors, or the like; not shown) formed thereon.

With continued reference to FIG. 2A, the respective semiconductor die 200' may include a plurality of conductive features 202 formed on the first surface 201a of the semiconductor substrate 201. For example, the conductive features 202 include conductive pads, conductive bumps, conductive lines, and/or the like, and the semiconductor devices formed in the semiconductor substrate 201 may be electrically coupled to the conductive features 202. In some embodiments, the conductive feature 202 has one side connected to a bonding feature 203 and the other side connected to a conductive through via 204'. In some embodiments, the respective conductive through via 204' is embedded inside the semiconductor substrate 201 at this stage and may be accessibly exposed during a subsequent process. Examples for conductive material(s) of the conductive features 202, the bonding feature 203, and the conductive through via 204' include copper, aluminum, gold, nickel, silver, palladium, tin, solder, metal alloy, the like, and/or combinations thereof.

The respective bonding feature 203 is covered by the dielectric layer 90'. In some embodiments, the bonding features 203 are formed after deposition of the dielectric layer 90' using such as a damascene process or the like. For example, the respective bonding feature 203 includes a bonding via 2031 landing on the conductive feature 202, and a bonding pad 2032 disposed on the bonding via 2031. Alternatively, the bonding feature 203 may only have the bonding pad or may only have the bonding via. In some embodiments, bonding surfaces 203s of the bonding features 203 are subsequently leveled (e.g., coplanar) with one another. The bonding via 2031 and the bonding pad 2032 may be covered by the dielectric layer 90', where the dielectric layer 90' may include a bonding dielectric sublayer (not independently illustrated) laterally covering the bonding features 203. In some embodiments, the bonding surfaces 203s of the bonding features 203 are subsequently leveled (e.g., coplanar) with a bonding surface 90s of the dielectric layer 90'. In some embodiments, the bonding surfaces 203s of the bonding features 203 are substantially leveled (e.g., coplanar) with bonding surfaces 106s of the electrode connectors 106 of the capacitor structure 100. For example, a planarization process (e.g., chemical mechanical polishing (CMP), grinding, etching, combinations thereof, and/or the like) is performed to form planar bonding surfaces of various components shown in FIG. 2A.

Figure 2B:
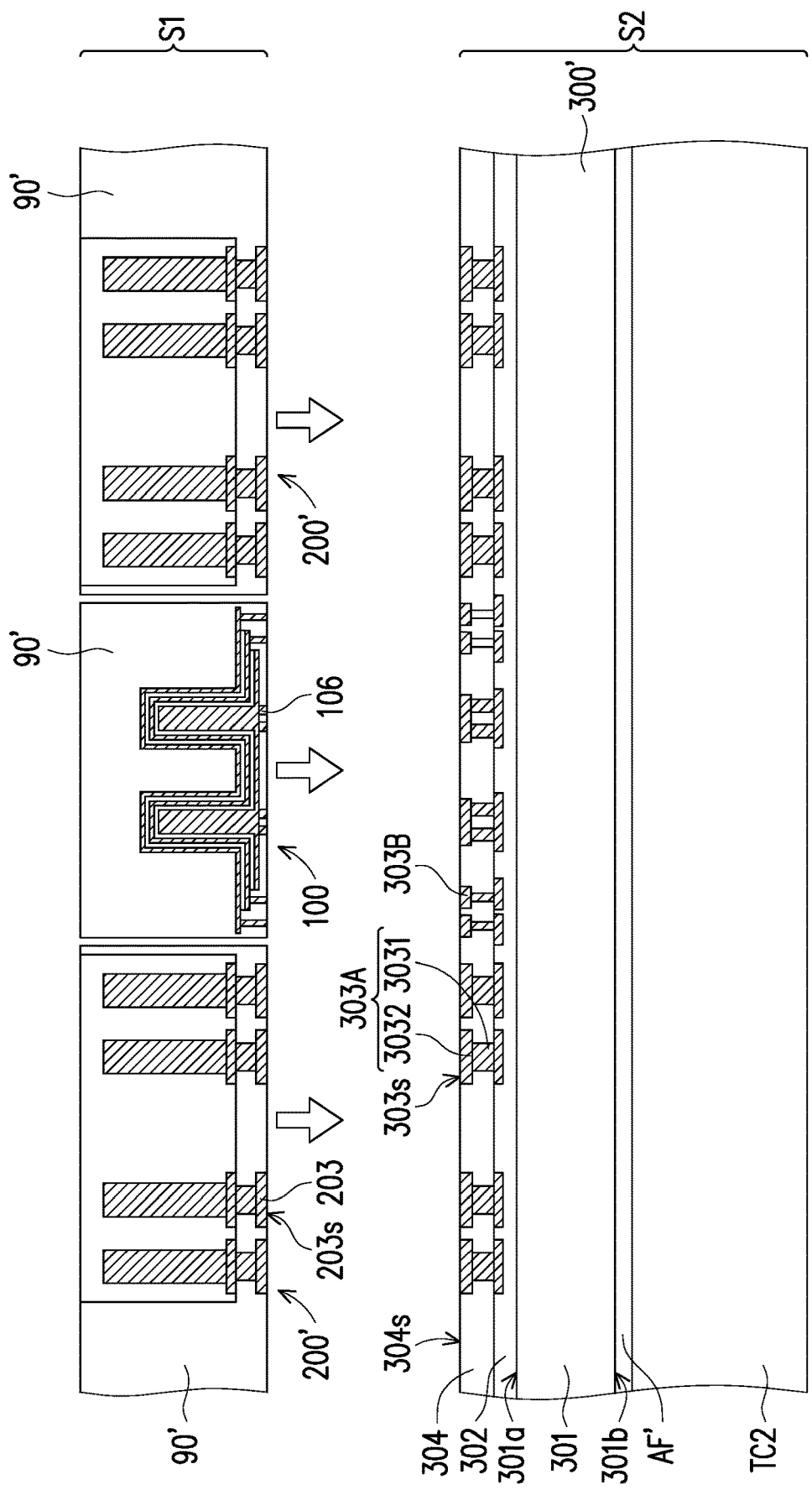

Referring to FIG. 2B and with reference to FIG. 2A, the components (e.g., the capacitor structures 100 and the semiconductor dies 200') shown in FIG. 2A are respectively prepared to be bonded to a semiconductor wafer 300'. In some embodiments, a singulation process is performed to cut off the dielectric layer 90' to separate the capacitor structures 100 from one another. The respective capacitor structure 100 covered by the dielectric layer 90' may be picked up to be bonded to an intended region of the semiconductor wafer 300'. The singulation process may also be performed onto the dielectric layer 90' that covers the semiconductor dies 200' to separate the semiconductor dies 200' from one another, and then the respective unit of the semiconductor die 200' covered by the dielectric layer 90' may be picked up to be bonded to another intended region of the semiconductor wafer 300'. The temporary carrier TC that supports the capacitor structures 100 and the temporary carrier TC1 that supports the semiconductor dies 200' may be removed before (or after) the singulation using any suitable process such as CMP, grinding, etching, a combination thereof, or the like.

Figure 2C:
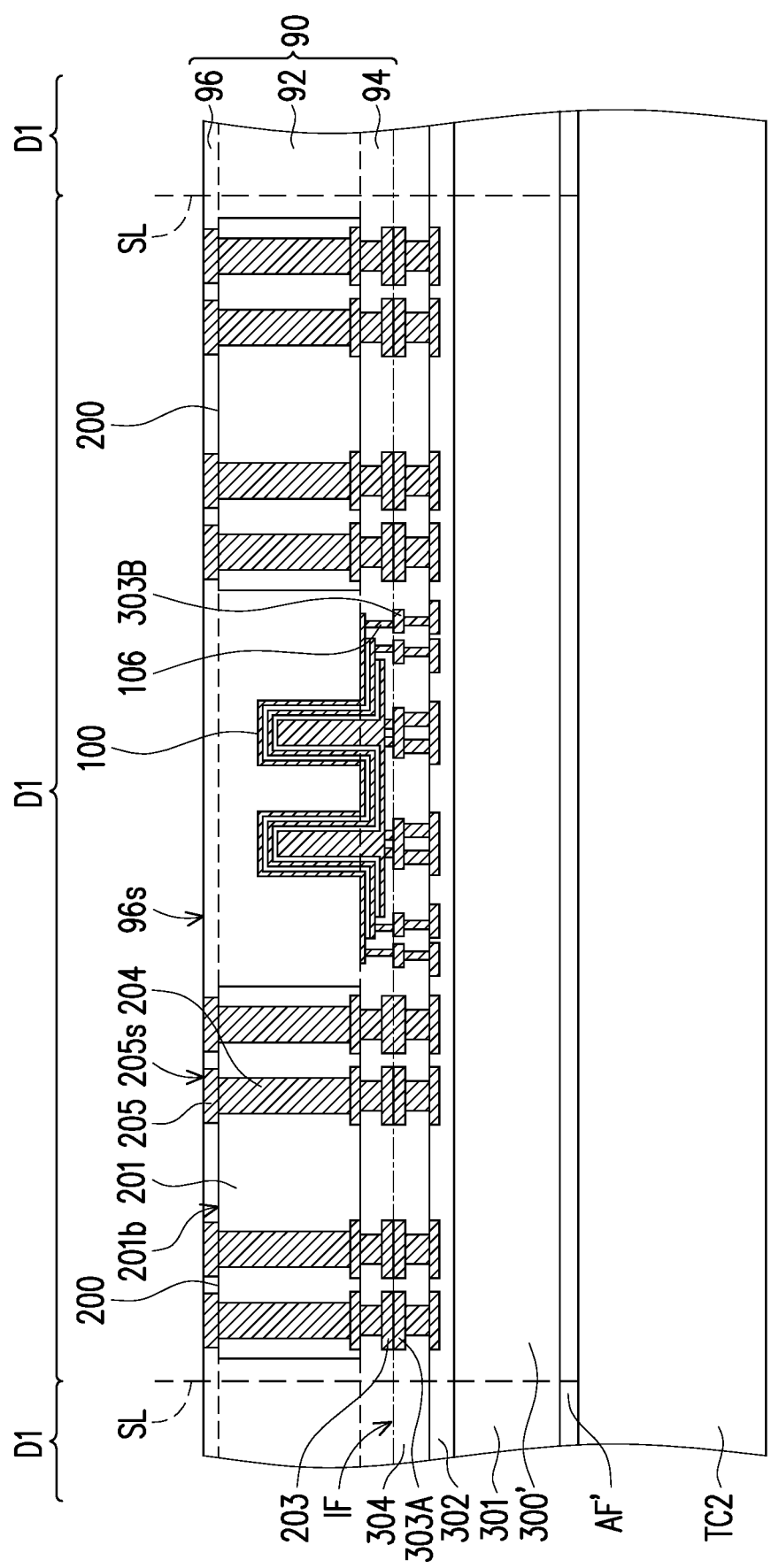
Figure 2D:
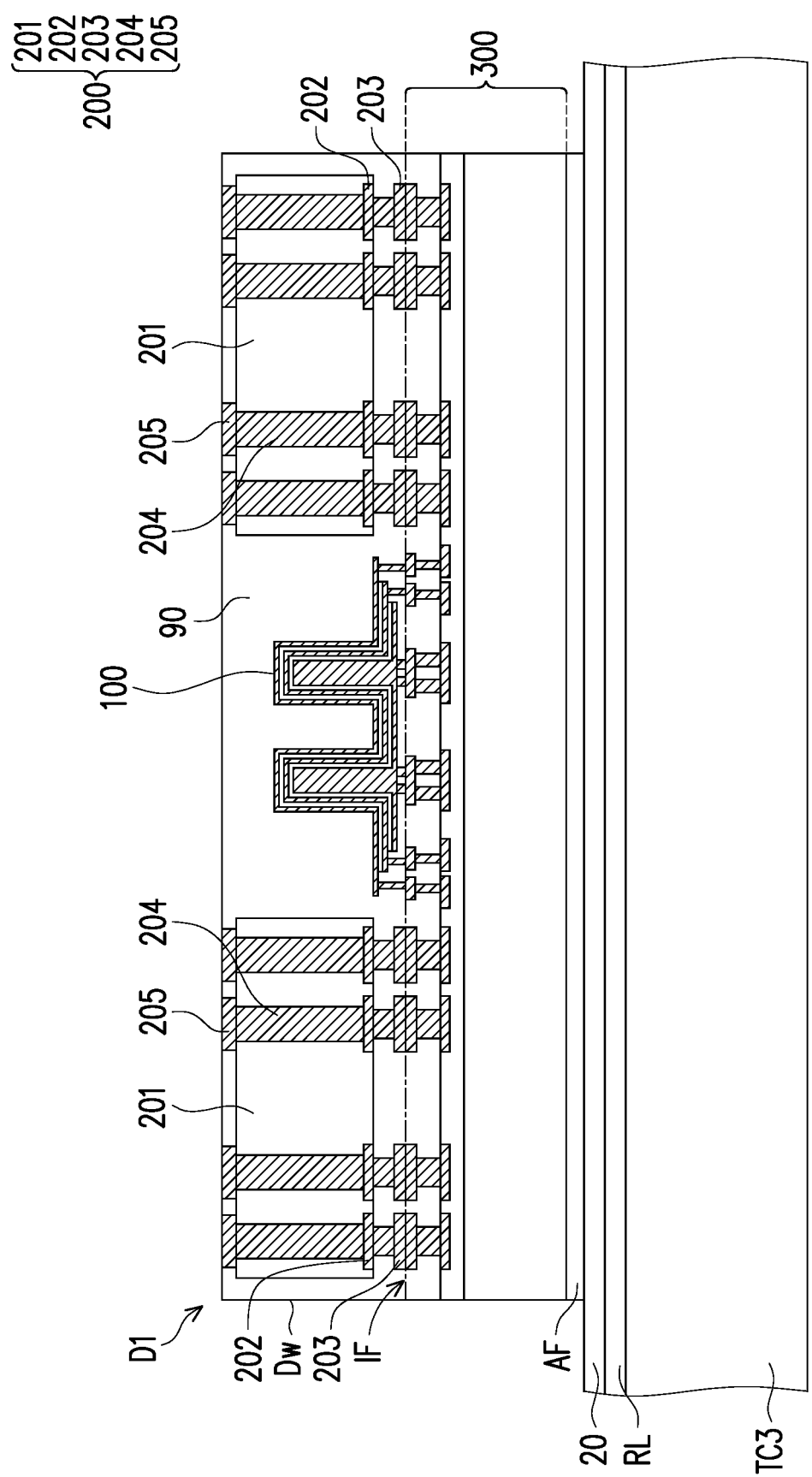

In some embodiments, the semiconductor wafer 300' includes different die regions that are singulated in subsequent steps to form a plurality of semiconductor dies (labeled as 300 in FIG. 2D). For example, the semiconductor wafer 300' is disposed over a temporary carrier TC2 for support, where the temporary carrier TC2 may be similar to the temporary carrier TC described in the preceding paragraphs such that the details thereof are omitted. In some embodiments, an attach film AF' is interposed between the temporary carrier TC2 and the semiconductor wafer 300' to assist in the adherence therebetween. In some embodiments, the attach film AF' is a die attach film (DAF). However, other types of adhesives may also be used.

The semiconductor wafer 300' may include a semiconductor substrate 301 (e.g., a bulk semiconductor, a SOI substrate, a multi-layered substrate, a gradient substrate, or the like). The material of the semiconductor substrate 301 may include silicon, germanium, a compound semiconductor (e.g., silicon carbide, gallium arsenic, gallium phosphide, indium phosphide, indium arsenide, etc.), an alloy semiconductor (e.g., SiGe, GaAsP, AlInAs, AlGaAs, GaInAs, GaInP, etc.), or combinations thereof. The semiconductor substrate 301 may have an active side 301a and a rear side 301b opposite to each other, where the rear side 301b may be attached to the temporary carrier TC2 through the release layer RL, and semiconductor devices (e.g., transistors, diodes, capacitors, resistors, inductors, and/or the like; not shown) may be formed at the active side 301a.

With continued reference to FIG. 2B, the semiconductor wafer 300' may include an interconnect structure 302 formed over the active side 301a of the semiconductor substrate 301, where the interconnect structure 302 interconnects the semiconductor devices on the semiconductor substrate 301 to form an integrated circuit. The interconnect structure 302 may be formed of alternating layers of dielectric and metallization patterns with vias interconnecting the layers of metallization patterns (not shown), where the metallization patterns including metal lines and vias are electrically coupled to the semiconductor devices on the semiconductor substrate 301.

The semiconductor wafer 300' may further include bonding features (303A and 303B) formed over the interconnect structure 302. For example, the bonding features (303A and 303B) are physically and electrically connected to the topmost layer of metallization patterns in the interconnect structure 302. In some embodiments, the respective bonding feature 303A includes a bonding via 3031 landing on the topmost layer of metallization patterns in the interconnect structure 302, and a bonding pad 3032 disposed on the bonding via 3031. Alternatively, the bonding feature 303A may only have the bonding pad or may only have the bonding via. The bonding features 303B may be similar to the bonding features 303A, except that the bonding features 303A are configured to be bonded to the bonding features 203 on the semiconductor dies 200', and the bonding features 303B are configured to be bonded to the electrode connectors 106 of the capacitor structure 100. The bonding features 303A may be formed in a similar manner as the bonding features 203 described previously. In some embodiments, the dimension of the bonding surface 303s of the respective bonding feature 303A substantially matches the dimension of the bonding surface 203s of the corresponding bonding feature 203. The dimension of the bonding surface of the respective bonding feature 303B may (or may not) substantially match the dimension of the bonding surface of the respective electrode connector 106.

Still referring to FIG. 2B, a bonding dielectric layer 304 may be formed over the interconnect structure 302 to laterally cover the bonding features (303A and 303B). The bonding dielectric layer 304 may be formed from one or more layers of one or more dielectric materials. Examples of suitable materials for the bonding dielectric layer 304 include, but are not limited to, an oxide, a nitride, an oxynitride, a combination thereof, and/or the like. In some embodiments, the bonding dielectric layer 304 includes a silicon-containing material such as silicon oxide, silicon oxynitride, silicon nitride, or the like. The bonding dielectric layer 304 and/or the bonding portion (e.g., 94) of the dielectric layer 90' may be referred to as a bonding oxide. In some embodiments, a bonding surface 304s of the bonding dielectric layer 304 is substantially leveled (e.g., coplanar) with the bonding surface 303s of the bonding features (303A and 303B).

In some embodiments, before performing a bonding process, a surface treatment (e.g., plasma treatment) may be performed on the structures including the bonding features (e.g., 106 and 203) and the dielectric layers 90' of the upper structure S1 and the bonding features (303A and 303B) and the bonding dielectric layer 304 of the lower structure S2. The upper structure S1 and the lower structure S2 shown in FIG. 2B may be treated with the same surface treatment process, or with different surface treatment processes. In some embodiments, after the surface treatment, the structures may be cleaned by chemical cleaning and/or de-ionized water cleaning.

Referring to FIG. 2C and with reference to FIG. 2B, the respective upper structure S1 and the lower structure S2 shown in FIG. 2B are bonded together. For example, the respective upper structure S1 and the lower structure S2 are aligned, with the bonding features 203 being aligned with the bonding features 303A and the electrode connectors 106 being aligned with the bonding features 303B. After the alignment, the respective upper structure S1 and the lower structure S2 may be pre-bonded and pressed against each other. After the pre-bonding, the dielectric materials and the conductive materials of the upper structures S1 are bonded to the dielectric material and the conductive material of the lower structure S2, respectively. For example, the bonding dielectric layer 304 is bonded to the dielectric layers 90', the bonding features 303A and 203 are bonded to each other, and the bonding features 303B are bonded to the electrode connectors 106. The bonds of the structure may be strengthened in an annealing process. For example, during the annealing, metals in the bonding features 303A and 203 may diffuse to each other to form metal-to-metal bonds, metals in the bonding features 303B and the electrode connectors 106 may also diffuse to each other to form the metal-to-metal bonds. In some embodiments, metal-to-dielectric bonds are also formed at the bonding interface IF.

With continued reference to FIG. 2C and FIG. 2B, after the bonding, a dielectric material may be formed over the semiconductor wafer 300' to encapsulate the dielectric layer 90' that covers the semiconductor dies 200' and the dielectric layer 90' that covers the capacitor structure 100, where the dielectric material may be the same material as the dielectric layer 90' so that no visible interface may be formed therebetween. Subsequently, excess dielectric material may be removed to form the dielectric sublayers (92 and 94), and the semiconductor substrate 201 may be ground until the conductive through vias 204' are accessibly exposed. The exposed conductive through vias 204' that penetrate through the semiconductor substrate 201 may be referred to as through substrate vias (TSVs) 204. In some embodiments, a dielectric sublayer 96 is formed on the dielectric sublayer 92 and the second surfaces 201b of the semiconductor substrates 201. The material of the dielectric sublayer 96 may be similar to the underlying dielectric sublayer (92 or 94). In some embodiments in which the dielectric sublayers are of the same material, no visible interface may be formed between these sublayers, and thus the boundary of each sublayer is illustrated in dashed lines. For example, the dielectric sublayers (92, 94, and 96) are collectively viewed as the dielectric layer 90 which buries the capacitor structure 100 and laterally covers the semiconductor dies 200.

In some embodiments, the respective semiconductor die 200 includes conductive pads 205 formed on the second surfaces 201b of the semiconductor substrates 201 and physically and electrically connected to the TSVs 204. For example, the conductive pads 205 are laterally covered by the dielectric sublayer 96. In some embodiments, a planarization process is performed, and the surfaces 205s of the conductive pads 205 and the surface 96s of the dielectric sublayer 96 may be substantially leveled (e.g., coplanar) within process variations. Alternatively, the planarization is skipped, for example, the conductive pads 205 may be buried at this stage and may be revealed in a subsequent grinding process when packaging. In some embodiments, the overall thickness of the respective semiconductor die 200 is greater than the overall thickness of the capacitor structure 100. The capacitor structure 100 may be fully buried in the dielectric layer 90, while the conductive pads 205 of the respective semiconductor die 200 may be accessibly exposed by the dielectric layer 90 for further electrical connection.

Still referring to FIG. 2C, a singulation process may be performed to cut along scribe lines SL to form a plurality of IC structures D1. During the singulation, the semiconductor wafer 300' may be divided into a plurality of semiconductor dies (labeled as 300 in FIG. 2D). For example, the singulation includes cutting off the dielectric layer 90 and the semiconductor wafer 300' (e.g., the bonding dielectric layer 304, the interconnect structure 302, and the semiconductor substrate 301). The IC structure D1 may thus have a coterminous sidewall (labeled as Dw in FIG. 2D) which includes sidewalls of the dielectric layer 90, the bonding dielectric layer 304, the interconnect structure 302, and the semiconductor substrate 301. In some embodiments, during the singulation, the attach film AF' is cut along with the overlying structure.

Referring to FIG. 2D and with reference to FIG. 2C, after the singulation, the IC structures D1 may be de-bonded from the temporary carrier TC2 and placed over a temporary carrier TC3 for packaging. The temporary carrier TC3 may be similar to the temporary carrier described previously, such that the details thereof are not repeated. In some embodiments, the temporary carrier TC3 is provided with a release layer RL, and the IC structure D1 is disposed over the release layer RL. The release layer RL may be or may include a light to heat conversion (LTHC) material or ultra-violet (UV) glue which loses its adhesive properties when exposed to UV light. However, other types of adhesives, (e.g., pressure-sensitive adhesives, radiation-curable adhesives, epoxies, combinations of these, etc.) may be used. In some embodiments, a protection layer 20 is initially formed on the release layer RL, and then the IC structure D1 is attached to the protection layer 20 through the singulated attach film AF. The protection layer 20 may be a polymer such as polybenzoxazole (PBO), polyimide (PI), benzocyclobutene (BCB), a combination thereof, or any suitable dielectric material. Alternatively, the protection layer 20 and/or the singulated attach film AF is omitted.

Figure 2E:
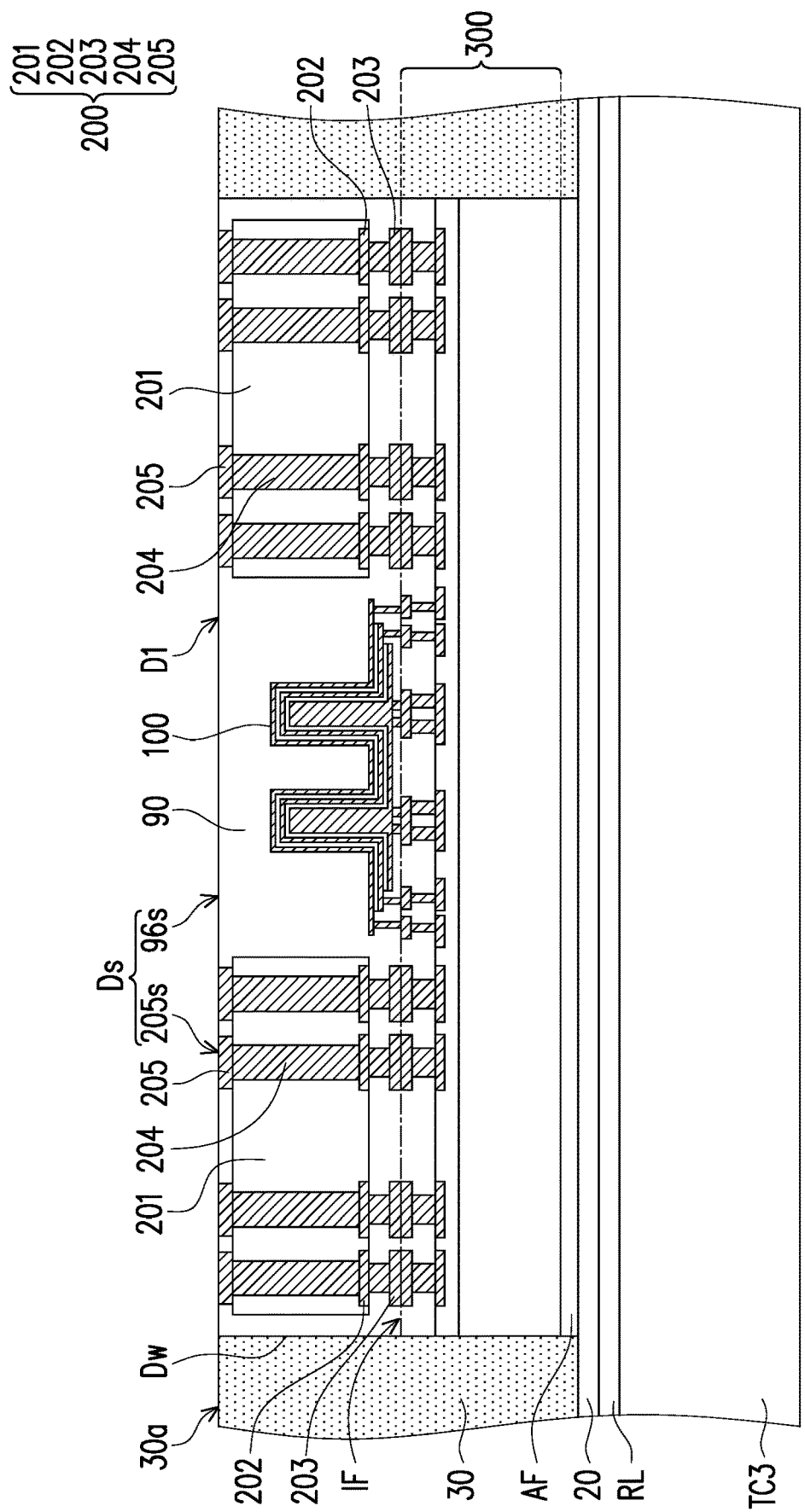

Referring to FIG. 2E, an insulating encapsulation 30 is formed over the temporary carrier TC3. In some embodiments, an insulating material (e.g., molding compound, molding underfill, epoxy resin, or the like) is formed on the protection layer 20 by suitable process such as compression molding, transfer molding, etc. A curing process is optionally performed to harden the insulating material for optimum protection. For example, the IC structure D1 is over-molded by the insulating material, and then a planarization process (e.g., CMP, grinding, etching, and/or the like) may be performed on the insulating material to form the insulating encapsulation 30. In some embodiments in which the conductive pads 205 are fully covered, during the planarization, the IC structure D1 is ground until the conductive pads 205 are accessibly revealed for further electrical connection. For example, after the planarization, at least a portion of the conductive pads 205 of the semiconductor dies 200 may be accessibly revealed, and the capacitor structure 100 may remain fully buried inside the dielectric layer 90.

As shown in FIG. 2E, the insulating encapsulation 30 may surround the IC structure D1 and extend along the sidewall Dw of the IC structure D1. In some embodiments, the insulating encapsulation 30 is in direct contact with the dielectric layer 90, where the insulating encapsulation 30 and the dielectric layer 90 are of different materials. For example, the dielectric layer 90 is an oxide layer and the insulating encapsulation 30 is a molding compound. The insulating encapsulation 30 may also laterally cover the singulated attach film AF. In some embodiments, a surface 30a of the insulating encapsulation 30 is substantially leveled (e.g., coplanar) with a surface Ds of the IC structure D1, where the surface Ds includes the surfaces 205s of the conductive pads 205 and the surface 96s of the dielectric layer 90.

Figure 2F:
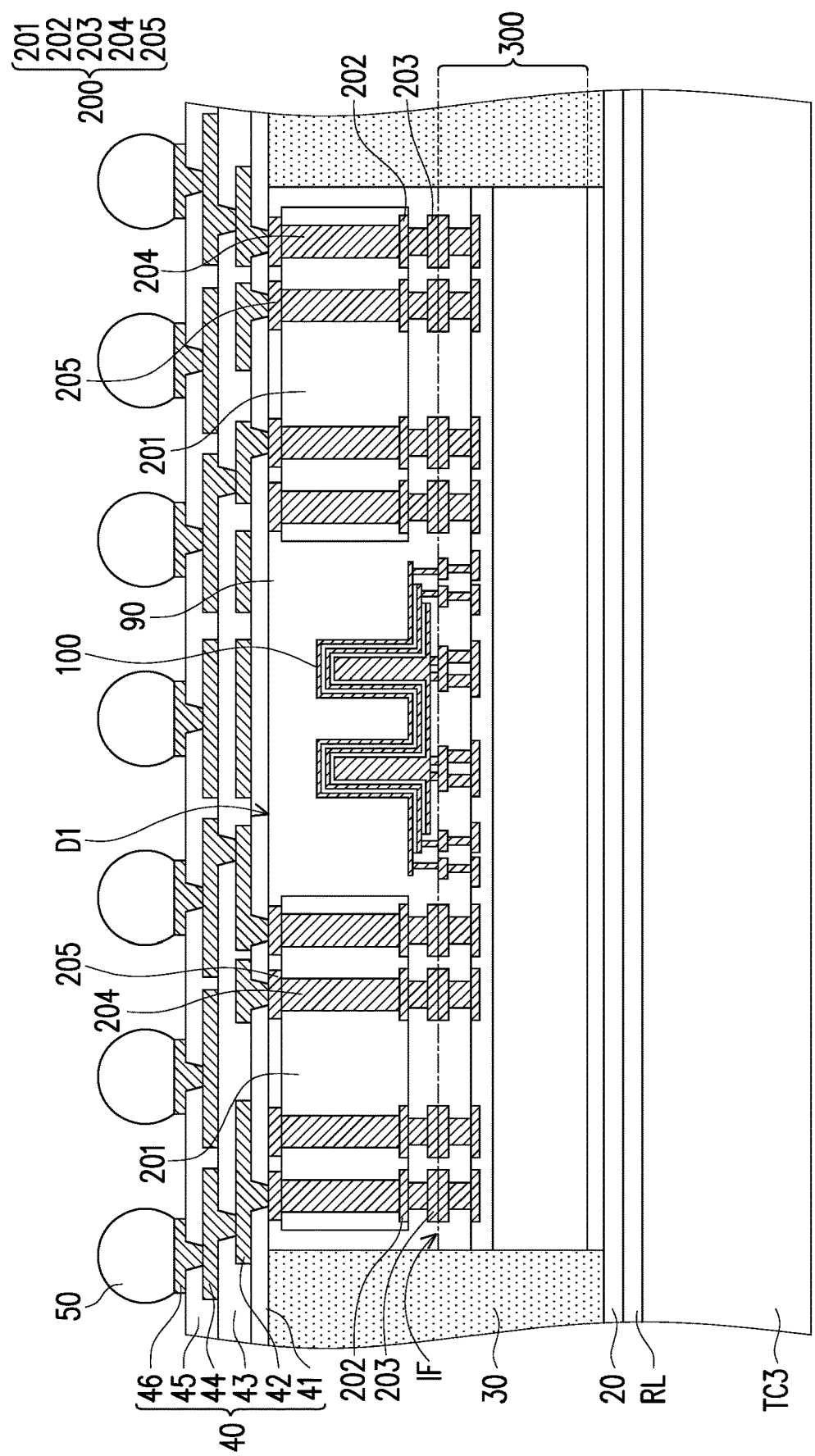

Referring to FIG. 2F, a redistribution structure 40 including at least one patterned dielectric layer and at least one patterned conductive layer may be formed on the insulating encapsulation 30 and the IC structure D1. In some embodiments, the redistribution structure 40 includes patterned dielectric layers (41, 43, and 45) and patterned conductive layers (42, 44, and 46). The redistribution structure 40 is shown as an example having three layers of dielectric and conductive patterns; however, more or fewer patterned dielectric layers and patterned conductive layers may be formed in the redistribution structure 40. The material(s) of the patterned dielectric layers (41, 43, and 45) may be or may include a photo-sensitive material such as PBO, PI, BCB, a combination thereof, or the like. The material(s) of the patterned conductive layer (42, 44, and 46) may be or may include copper, nickel, titanium, a combination thereof, or the like.

The patterned conductive layers (42, 44, and 46) may include conductive features such as conductive lines, conductive vias, and/or conductive pads, and may be formed by patterning and metallization techniques (e.g., lithography, etching, CMP, thin-film deposition, plating, damascene processing, etc.) or any suitable process. The patterned conductive layers (42, 44, and 46) may be referred to as redistribution layers or redistribution lines. The bottommost patterned conductive layer 42 may be physically and electrically connected to the conductive pads 205 of the IC structure D1. For example, the patterned conductive layers (42, 44, and 46) are electrically coupled to the semiconductor die 300 through the semiconductor dies 200. In some embodiments, the topmost patterned conductive layer 46 includes under bump metallization (UBM) pads for the subsequently formed terminals landing thereon.

With continued reference to FIG. 2F, a plurality of conductive terminals 50 may be formed on the topmost patterned conductive layer 46 of the redistribution structure 40. The conductive terminals 50 may include a conductive material such as solder, copper, aluminum, gold, nickel, silver, palladium, tin, the like, and/or a combination thereof. The conductive terminals 50 may be or may include solder balls, metal pillars, controlled collapse chip connection (C4) bumps, micro-bumps, electroless nickel-electroless palladium-immersion gold (ENEPIG) bumps, ball grid array (BGA) connectors, and/or the like, and may be formed by ball placement, evaporation, electroplating, printing, solder transfer, or any suitable process.

Figure 2G:
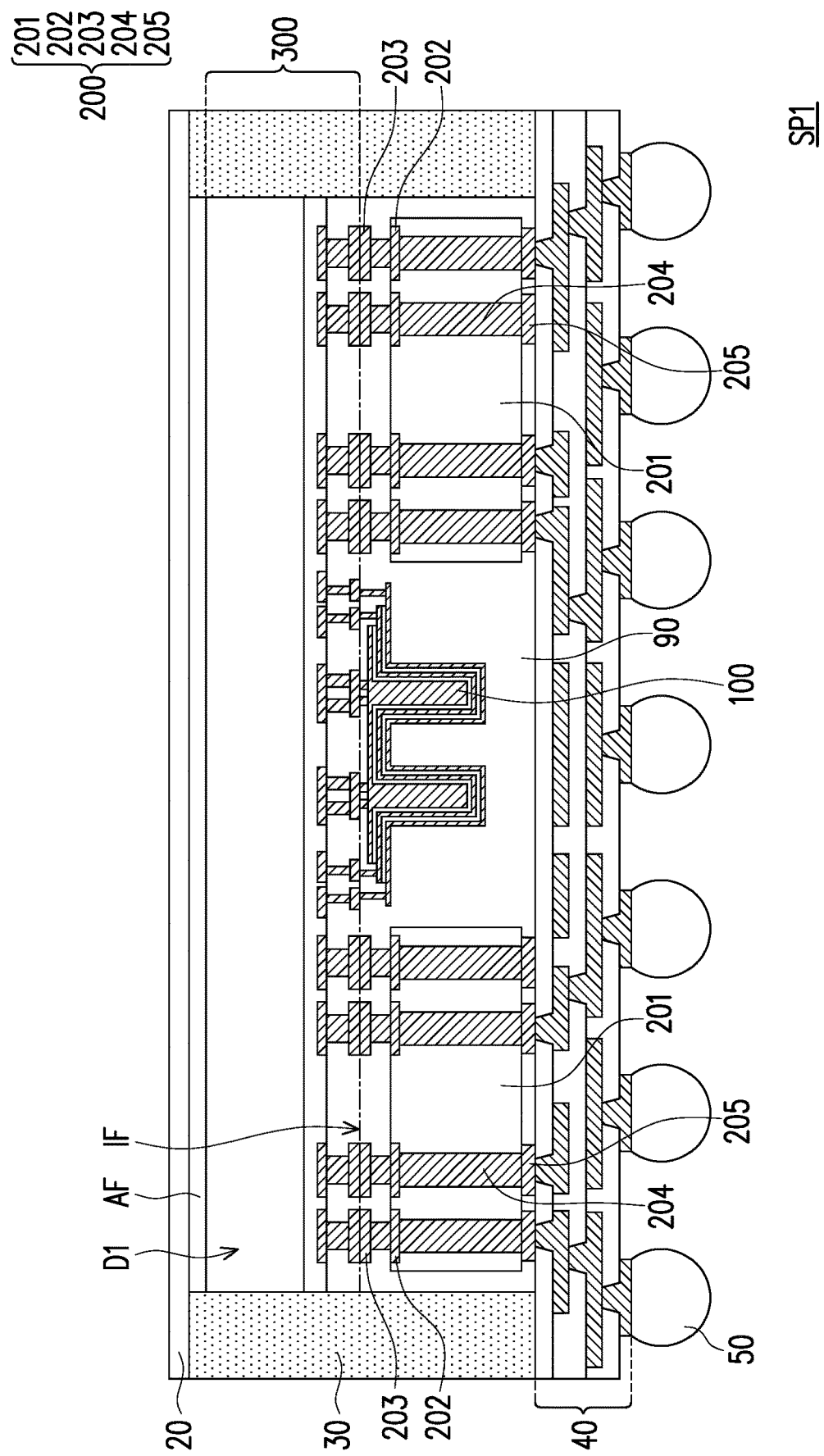

Referring to FIG. 2G and with reference to FIG. 2F, the temporary carrier TC3 may be removed, and a singulation process may be performed to form a semiconductor package SP1. The de-bonding process of the temporary carrier TC3 may be performed prior to the singulation. For example, after forming the conductive terminals 50, the external energy (e.g., UV laser, visible light or heat) is applied to the release layer RL to lose its adhesiveness, so that the temporary carrier TC3 and the release layer RL may be detached from the protection layer 20. A cleaning process may be performed after the de-bonding. Subsequently, the resulting structure may be disposed on a dicing tape for performing the singulation. Alternatively, the singulation is performed before de-bonding the temporary carrier TC3. The singulation may include cutting off the redistribution structure 40, the insulating encapsulation 30, and the protection layer 20.

As shown in FIG. 2G, the semiconductor package SP1 includes the IC structure D1 laterally covered by the insulating encapsulation 30, the redistribution structure 40 disposed on the IC structure D1 and the insulating encapsulation 30, and the conductive terminals 50 disposed on the redistribution structure 40 and electrically coupled to the IC structure D1 through the redistribution structure 40. In some embodiments, the semiconductor package SP1 is referred to as an integrated fan-out package and the redistribution structure 40 is referred to as a fan-out redistribution structure. The IC structure D1 of the semiconductor package SP1 may include the semiconductor dies 200 physically bonded to and electrically coupled to the semiconductor die 300. The capacitor structure 100 may be disposed between the semiconductor dies 200 and also bonded to the semiconductor die 300. The trench portions of the capacitor structure 100 may extend to be in proximity to the redistribution structure 40, and the dielectric layer 90A is interposed between the trench portions of the capacitor structure 100 and the redistribution structure 40. The capacitor structure 100 may be physically and electrically connected to the semiconductor die 300, and the capacitor structure 100 may interact with the semiconductor die 300 to achieve a sufficiently high capacitance. In some embodiments, the semiconductor package SP1 includes a single capacitor structure 100, and the capacitor structure 100 may interact with the semiconductor die 300 but not with the semiconductor dies 200. Alternatively, more than one capacitor structure may be coupled together in parallel or series in the semiconductor package, depending on the application.

Advantages of embodiments of the disclosure include providing novel capacitor structure 100 designs for the semiconductor package. The capacitor structure 100 and the design thereof are implementable in manufacturing process flows for the formation of IC structure D1. When the capacitor structure 100 is connected across the semiconductor die 300, increasing the capacitive component (e.g., by using a larger capacitor) may provide better performance. For example, the capacitor structure 100 disposed above and bonded to the semiconductor die 300 may provide improved performance, relative to conventional implementations that have the capacitor disposed inside the semiconductor die.

FIGS. 3A-3H are schematic cross-sectional views of various stages of manufacturing a semiconductor package in accordance with some embodiments. Unless specified otherwise, the materials and the formation methods of the components in these embodiments are essentially the same as the like components, which are denoted by like reference numerals in the embodiments shown in FIGS. 2A-2G. The details regarding the materials of the components may thus be found in the discussion of the embodiments shown in FIGS. 2A-2G.

Figure 3A:
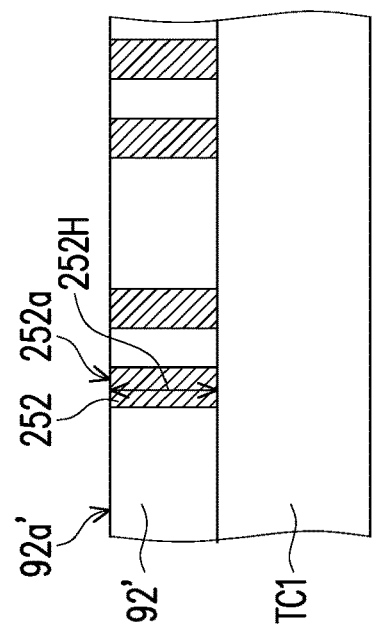
FIGS. 3A-3H are schematic cross-sectional views of various stages of manufacturing a semiconductor package in accordance with some embodiments.

Referring to FIG. 3A, the capacitor structure 100 covered by the dielectric sublayer 92' is formed over the temporary carrier TC. The formation of the capacitor structure 100 may be similar to the processes as mentioned in FIGS. 1A-1E, and thus the detailed descriptions are not repeated for the sake of brevity. In some embodiments, a plurality of via portions 252 is formed over the temporary carrier TC1, and the dielectric sublayer 92' may be formed over the temporary carrier TC1 and laterally covers the via portions 252. For example, the capacitor structure 100 and the via portions 252 are separately fabricated on individual temporary carriers as indicated by the dashed line. The material of the dielectric sublayer 92' may be similar to the material of the dielectric layer 90 described in the preceding paragraphs. The via portions 252 may include a conductive material (e.g., copper, titanium, tungsten, aluminum, metal alloy, a combination thereof, and/or the like), and may be formed by plating or other suitable deposition process.

In some embodiments, the planarization process is performed, and the first surfaces 252a of the via portions 252 are substantially leveled (e.g., coplanar) with the first surface 92a' of the dielectric sublayer 92' over the temporary carrier TC1. In some embodiments, the planarization process is performed to level the bonding surfaces 106s of the electrode connectors 106 of the capacitor structure 100 and the dielectric sublayer 92' over the temporary carrier TC. Alternatively, the planarization process on the via portions 252 and/or the electrode connectors 106 is skipped. The bottom of the capacitor structure 100 may be fully buried in the dielectric sublayer 92'. In some embodiments, comparing the via portions 252 and the capacitor structure 100, the vertical dimension 252H (e.g., height or thickness) of the respective via portion 252 is substantially greater than the overall vertical dimension 100H (e.g., height or thickness) of the capacitor structure 100.

Figure 3B:
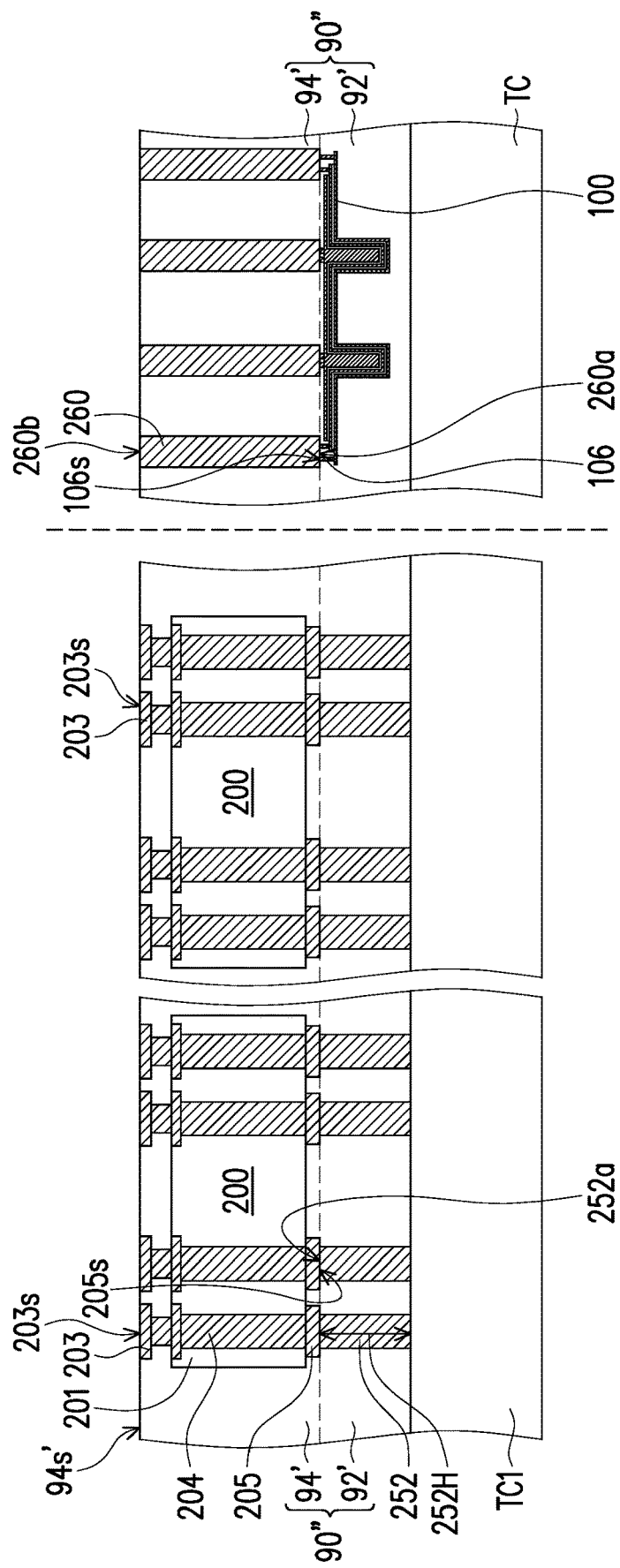

Referring to FIG. 3B, the semiconductor dies 200' may be bonded to the via portions 252 over the temporary carrier TC1. The dielectric sublayer 94' may be formed on the dielectric sublayer 92' and laterally covers the semiconductor dies 200'. In some embodiments, another dielectric sublayer 94' is formed on the dielectric sublayer 92' that covers the capacitor structure 100, and then a plurality of through dielectric vias (TDVs) 260 may penetrate through the dielectric sublayer 94' and may be physically and electrically coupled to the capacitor structure 100. The dielectric sublayer 94' that covers the TDVs 260 and the dielectric sublayer 94' that covers the semiconductor dies 200 may be the same (or similar) material(s). In some embodiments, the dielectric sublayers (92' and 94') are collectively viewed as the dielectric layer 90". It should be understood that the number of the semiconductor dies 200 and the TDVs 260 shown herein is merely an example and construes no limitation in the disclosure. Alternatively, the semiconductor dies 200 and the dielectric sublayer 94' covering the semiconductor dies 200 may be separately fabricated and then bonded to the via portions 252 and the dielectric sublayer 92' covering the via portions 252. Similarly, the TDVs 260 and the dielectric sublayer 94' covering the TDVs 260 may be separately fabricated and then bonded to the capacitor structure 100 and the dielectric sublayer 92' covering the capacitor structure 100.

In some embodiments, each of the conductive pads 205 of the respective semiconductor die 200 is in contact with one of the via portions 252. For example, the first surface 252a of each via portion 252 is directly bonded to the surface 205s of the corresponding conductive pad 205. The TSVs 204 of the respective semiconductor die 200 provide vertical and electrical connections between the conductive pads 205 and the bonding features 203 that are disposed at two opposing sides of the semiconductor die 200. The respective semiconductor die 200 may be embedded in the dielectric sublayer 94', where the conductive pads 205, the semiconductor substrate 201, and the bonding features 203 may be laterally covered by the dielectric sublayer 94'. In some embodiments, the bonding surfaces 203s of the bonding features 203 are subsequently leveled (e.g., coplanar) with the bonding surface 94s' of the dielectric sublayer 94'. In some embodiments, the respective TDV 260 includes a first bonding surface 260a directly bonded to the corresponding bonding surface(s) 106s of the electrode connector(s) 106 of the capacitor structure 100. The respective TDV 260 may include a second bonding surface 260b opposite to the first bonding surface 260a and subsequently leveled (e.g., coplanar) with the bonding surface 94s' of the dielectric sublayer 94'. It should be understood that the TDVs 260 and the electrode connectors 106 may be in one-to-multiple or one-to-one correspondence depending on product requirements.

Figure 3C:
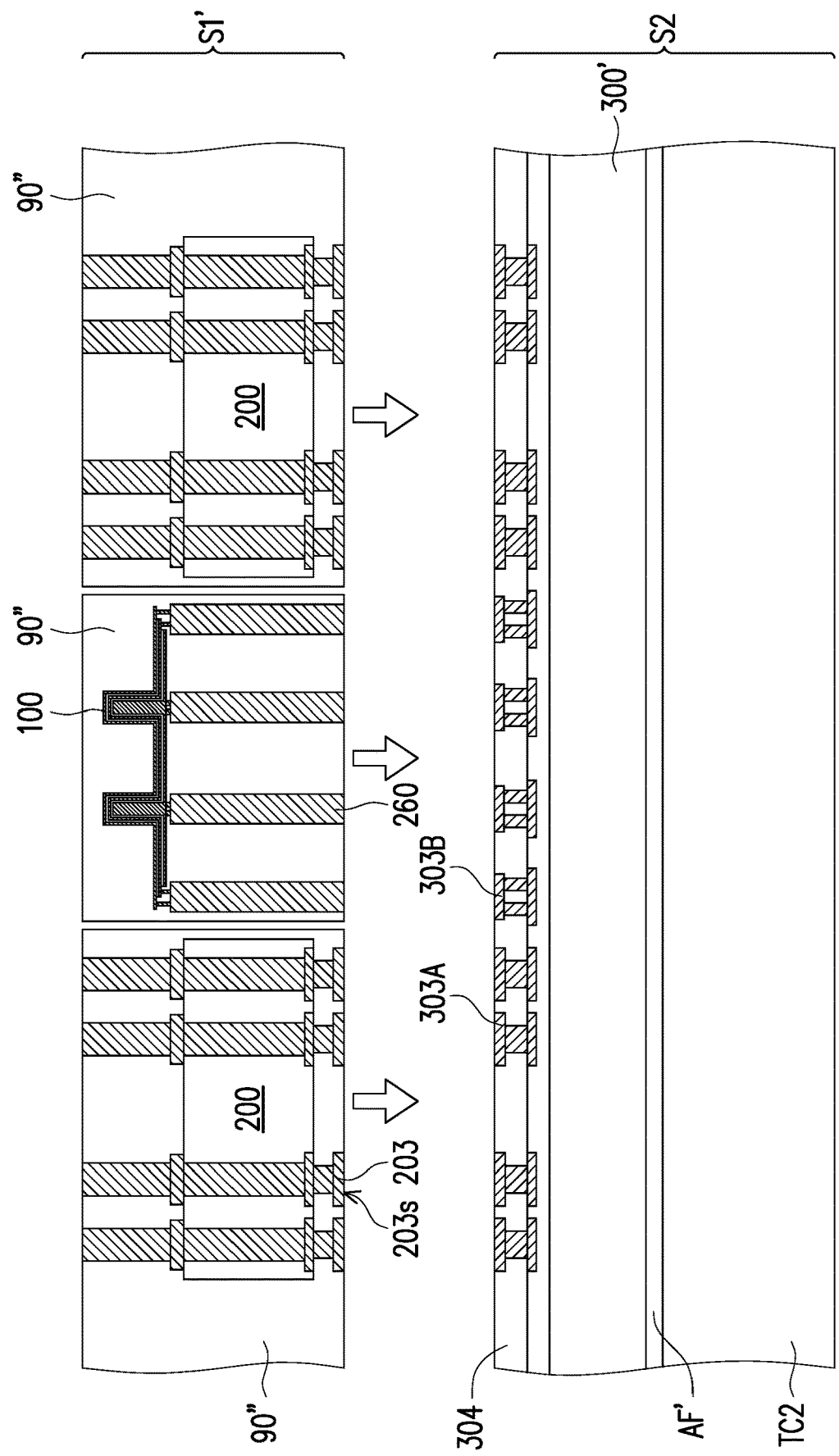

Referring to FIG. 3C and with reference to FIG. 3B, the components shown in FIG. 3B may be respectively prepared to be bonded to the semiconductor wafer 300'. For example, the singulation may be performed to cut through the dielectric layer 90" to separate the units including at least one semiconductor die 200 and the corresponding via portions 252 from one another. In some embodiments, the singulation is performed to cut through the dielectric layer 90" to separate the units including at least one capacitor structure 100 and the corresponding TDVs 260 from one another. The temporary carrier TC that supports the capacitor structures 100 and the temporary carrier TC1 that supports the via portions 252 may be removed before (or after) the singulation using any suitable process such as CMP, grinding, etching, a combination thereof, or the like.

The semiconductor wafer 300' may be disposed over the temporary carrier TC2 with the attach film AF' interposed therebetween, where the lower structure S2 including the temporary carrier TC2, the attach film AF', and the semiconductor wafer 300' may be similar to the lower structure S2 shown in FIG. 2B such that the detailed descriptions are omitted for the sake of brevity. Before the bonding, the surface treatment followed by the cleaning may be performed on the structures including the bonding features 203, the TDVs 260, and the dielectric layer 90" of the upper structures S1' and the bonding features 303A and 303B and the bonding dielectric layer 304 of the lower structure S2. The upper structures S1' and the lower structure S2 shown in FIG. 3C may be treated with the same surface treatment and/or cleaning process, or with different surface treatment and/or cleaning processes.

Figure 3D:
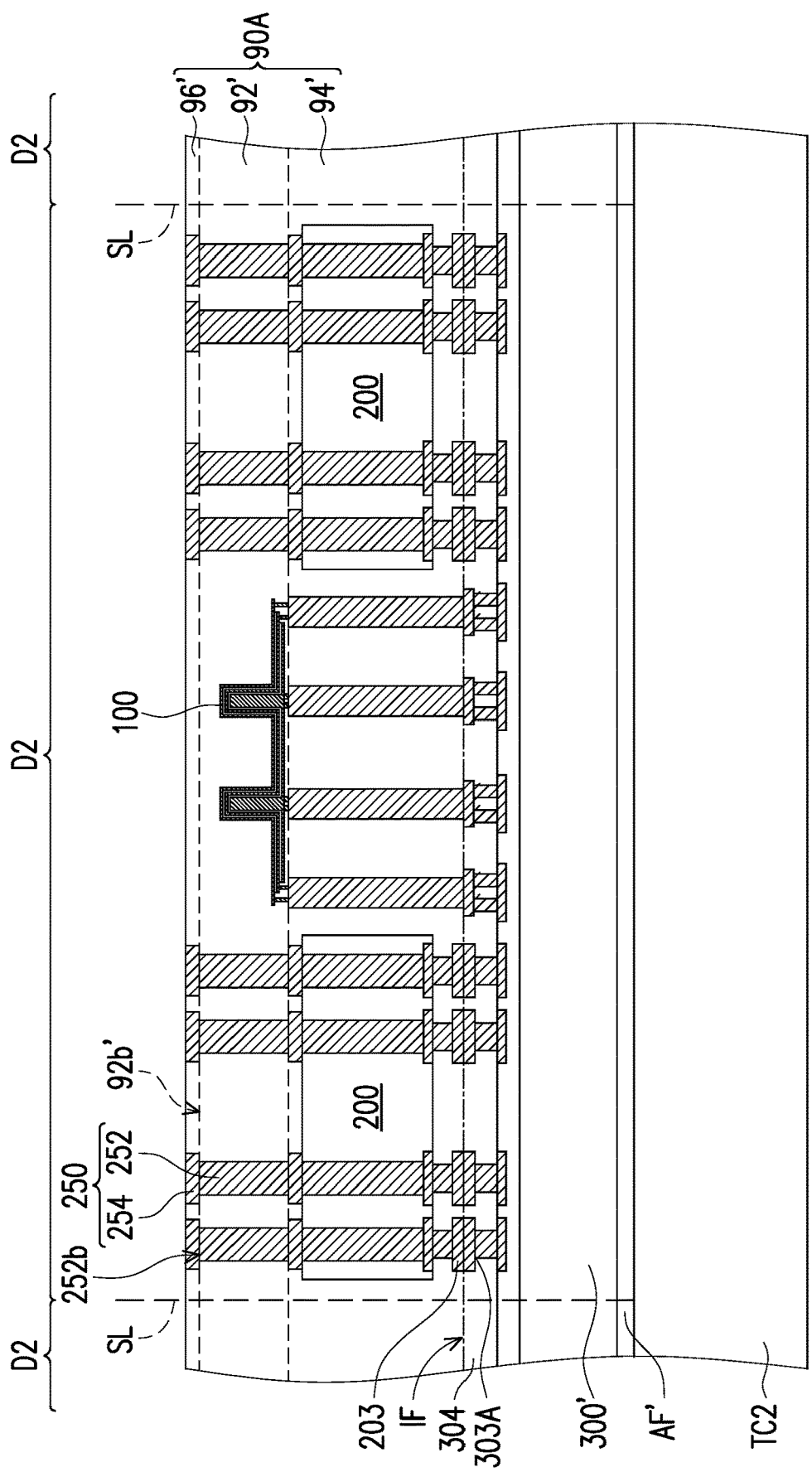

Referring to FIG. 3D and with reference to FIG. 3C, the upper structures S1' and the lower structure S2 shown in FIG. 3C may be bonded together. For example, the upper structures S1' is substantially aligned with the lower structure S2, and then each component of the upper structures S1' and the lower structure S2 may be pressed against each other. The annealing process may be performed to strengthen the bonds between the upper structures S1' and the lower structure S2. For example, after the bonding, the dielectric sublayer 94' is directly bonded to the bonding dielectric layer 304 of the semiconductor wafer 300', the bonding features 203 of the respective semiconductor die 200 are directly bonded to the bonding features 303A of the semiconductor wafer 300', and the TDVs 260 are directly bonded to the bonding features 303B of the semiconductor wafer 300'. It should be noted that the TDVs 260 and the bonding features 303B are illustrated as the via-to-pad bonds; however, the bonds of TDVs 260 and the bonding features 303B may be the via-to-via bonds or the pad-to-pad bonds. The bonding interface IF of the bonded structure may include including the metal-to-metal bonds and the dielectric-to-dielectric bonds. The metal-to-dielectric bonds may also be formed at the bonding interface IF.

With continued reference to FIG. 3D and FIG. 3C, after the bonding, a dielectric material may be formed over the semiconductor wafer 300' to encapsulate the dielectric layer 90" that covers the units including the semiconductor dies 200' and the corresponding via portions and the dielectric layer 90" that covers the units including the capacitor structure 100 and the corresponding TDVs, where the dielectric material may be the same material as the dielectric layer 90" so that no visible interface may be formed therebetween. Subsequently, excess dielectric material may be removed to form the dielectric sublayers (92' and 94').

In some embodiments, a dielectric sublayer 96' may be formed on the second surfaces 252b of the via portions 252 and the second surface 92b' of the dielectric sublayer 92', and a plurality of pad portions 254 may be formed in the dielectric sublayer 96' to be physically and electrically connected to the via portions 252. The dielectric sublayer 96' may be formed before (or after) forming the pad portions 254. The pad portions 254 may be fully embedded in the dielectric sublayer 96' at this stage and may be accessibly exposed in the subsequent grinding process. Alternatively, the pad portions 254 may be partially revealed by the dielectric sublayer 96' at this stage. In some embodiments, the dielectric sublayers (92', 94', and 96') are collectively viewed as a dielectric layer 90A, and the pad portion 254 and the underlying via portion 252 are collectively viewed as a conductive connector 250. In other embodiments, the dielectric sublayer 96' is omitted and only the pad portions 254 are formed over the via portions 252. Alternatively, the dielectric sublayer 96' and the pad portions 254 are all omitted.

Still referring to FIG. 3D, the singulation may be performed to cut along the scribe lines SL to form a plurality of IC structures D2. For example, during the singulation, the dielectric layer 90A and the underlying semiconductor wafer 300' are cut to form the coterminous sidewall of the respective IC structure D2. In some embodiments, during the singulation, the attach film AF' is cut along with the overlying structure.

Figure 3E:
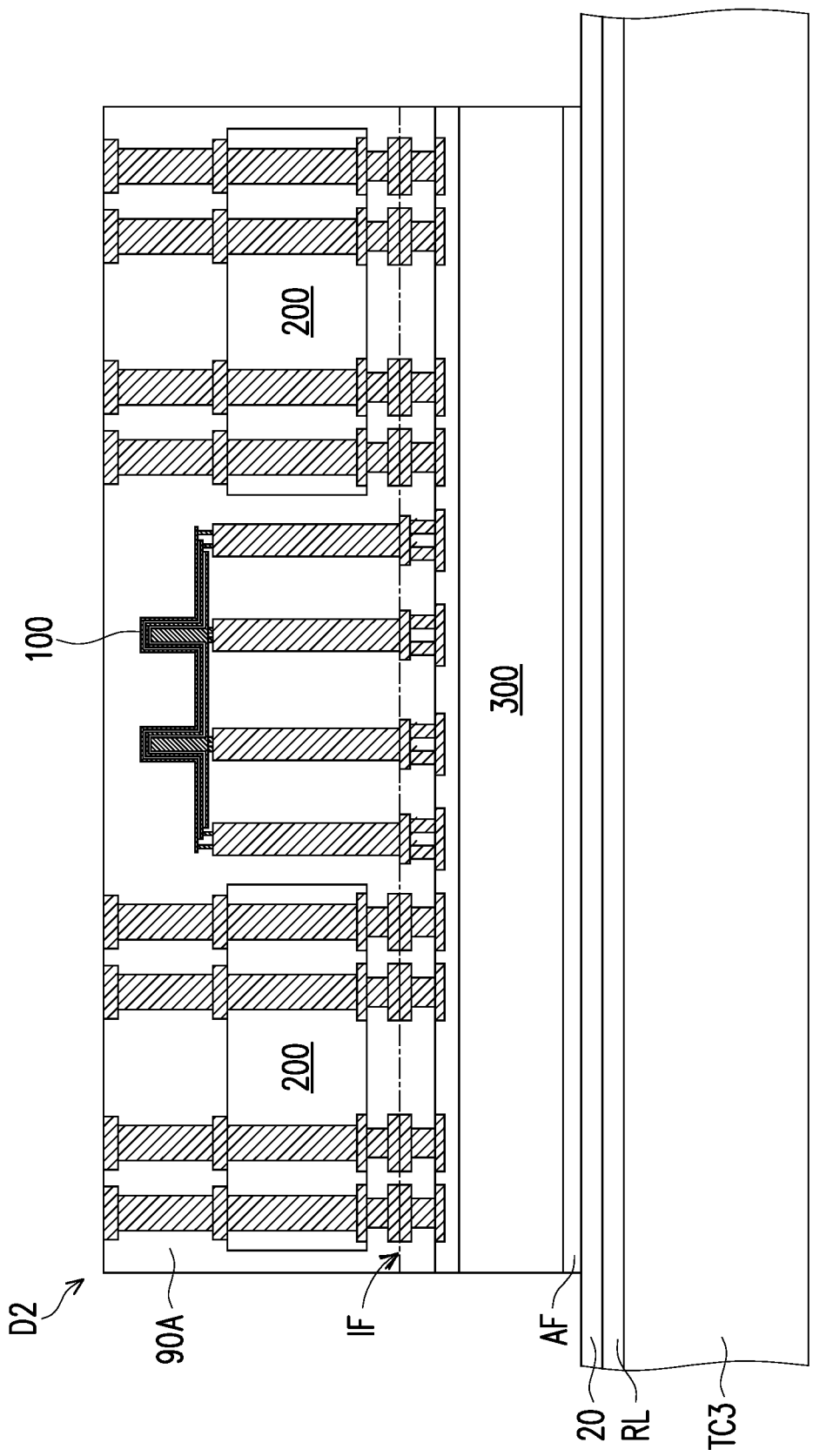

Referring to FIG. 3E and with reference to FIG. 3D, the IC structure D2 may be de-bonded from the temporary carrier TC2 and placed over the temporary carrier TC3 for packaging. The temporary carrier TC3 may be provided with the release layer RL, and the IC structure D2 may be disposed over the release layer RL. In some embodiments, the protection layer 20 is formed prior to the placement of the IC structure D2, and the IC structure D2 may be attached to the protection layer 20 through the singulated attach film AF. The structure shown in FIG. 3E may be similar to the structure shown in FIG. 2D, except for the IC structure D2. Thus, the detailed descriptions are not repeated for the sake of brevity.

Figure 3F:
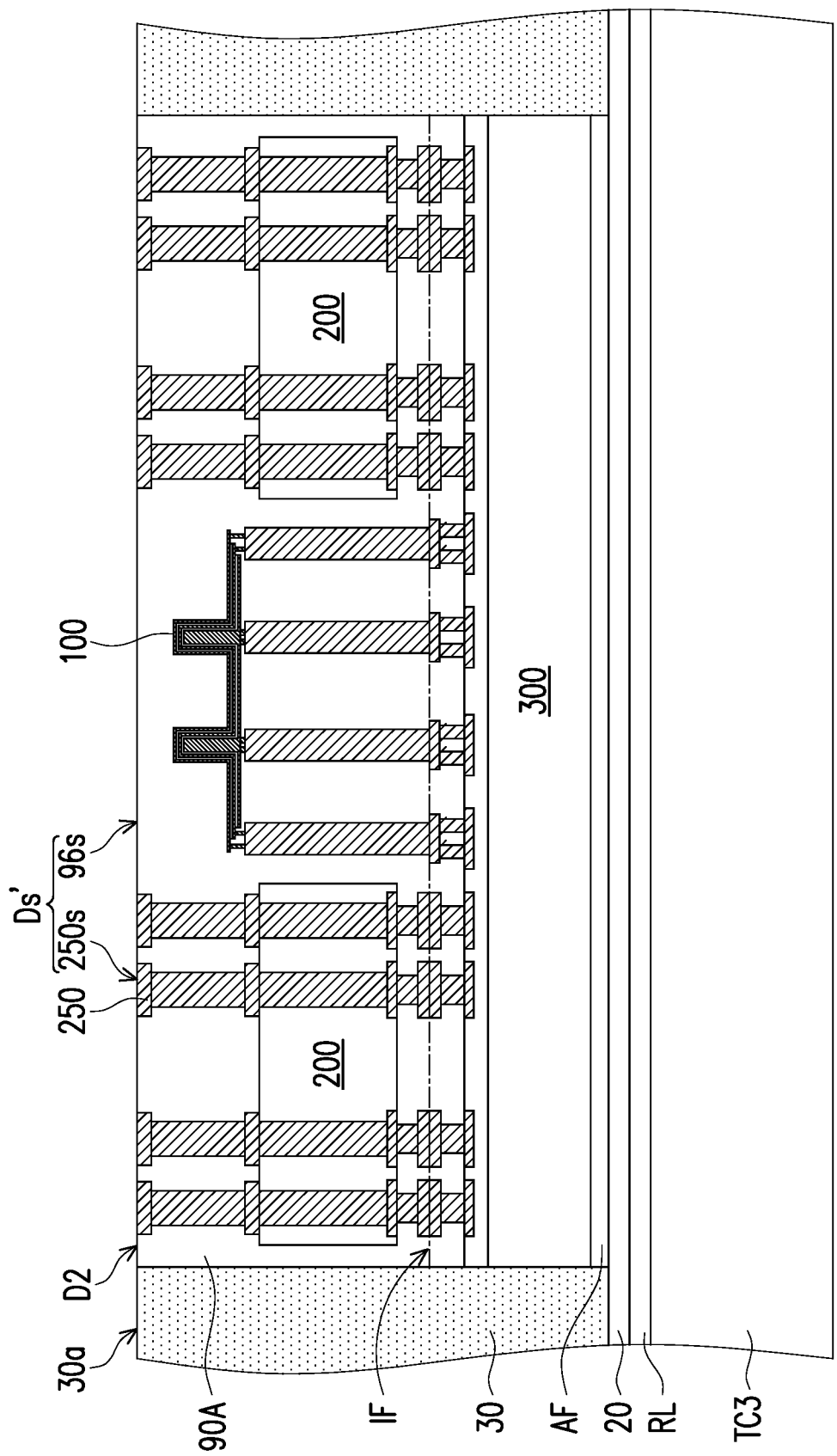

Referring to FIG. 3F, the insulating encapsulation 30 is then formed over the protection layer 20 to laterally cover the IC structure D2 and the singulated attach film AF. The formation of the insulating encapsulation 30 may be similar to the process described in FIG. 2E, and thus the details thereof are omitted. In some embodiments, the surface 30a of the insulating encapsulation 30 is substantially leveled (e.g., coplanar) with the surface Ds' of the IC structure D2, where the surface Ds' includes the surfaces 250s of the conductive connectors 250 and the surface 96s of the dielectric layer 90A. The structure shown in FIG. 3F may be similar to the structure shown in FIG. 2E, except for the IC structure D2. Thus, the detailed descriptions are not repeated for the sake of brevity.

Figure 3G:
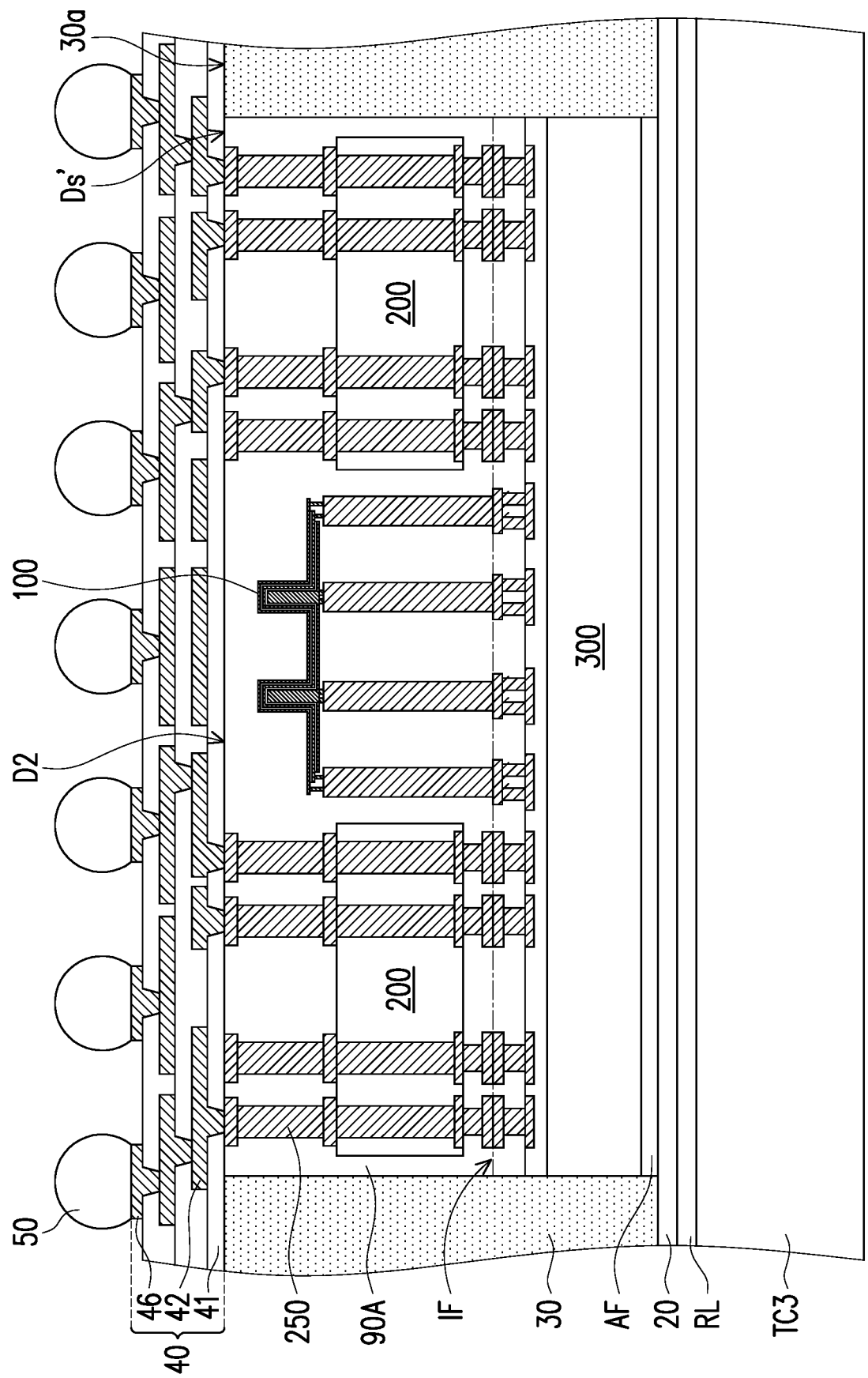

Referring to FIG. 3G, the redistribution structure 40 and the conductive terminals 50 may be sequentially formed over the IC structure D2 and the insulating encapsulation 30. The formation of the redistribution structure 40 may be similar to the process described in FIG. 2E, and the formation of the conductive terminals 50 may be similar to the process described in FIG. 2F. For example, the bottommost patterned dielectric layer 41 of the redistribution structure 40 is directly formed on the surface 30a of the insulating encapsulation 30 and the surface Ds' of the IC structure D2. The bottommost patterned conductive layer 42 may include conductive vias physically and electrically connected to the conductive connectors 250 of the IC structure D2. The conductive terminals 50 may be formed on the topmost patterned conductive layer 46 and may be electrically coupled to the IC structure D2 through the redistribution structure 40. The structure shown in FIG. 3G may be similar to the structure shown in FIG. 2F, except for the IC structure D2. Thus, the detailed descriptions are not repeated for the sake of brevity.

Figure 3H:
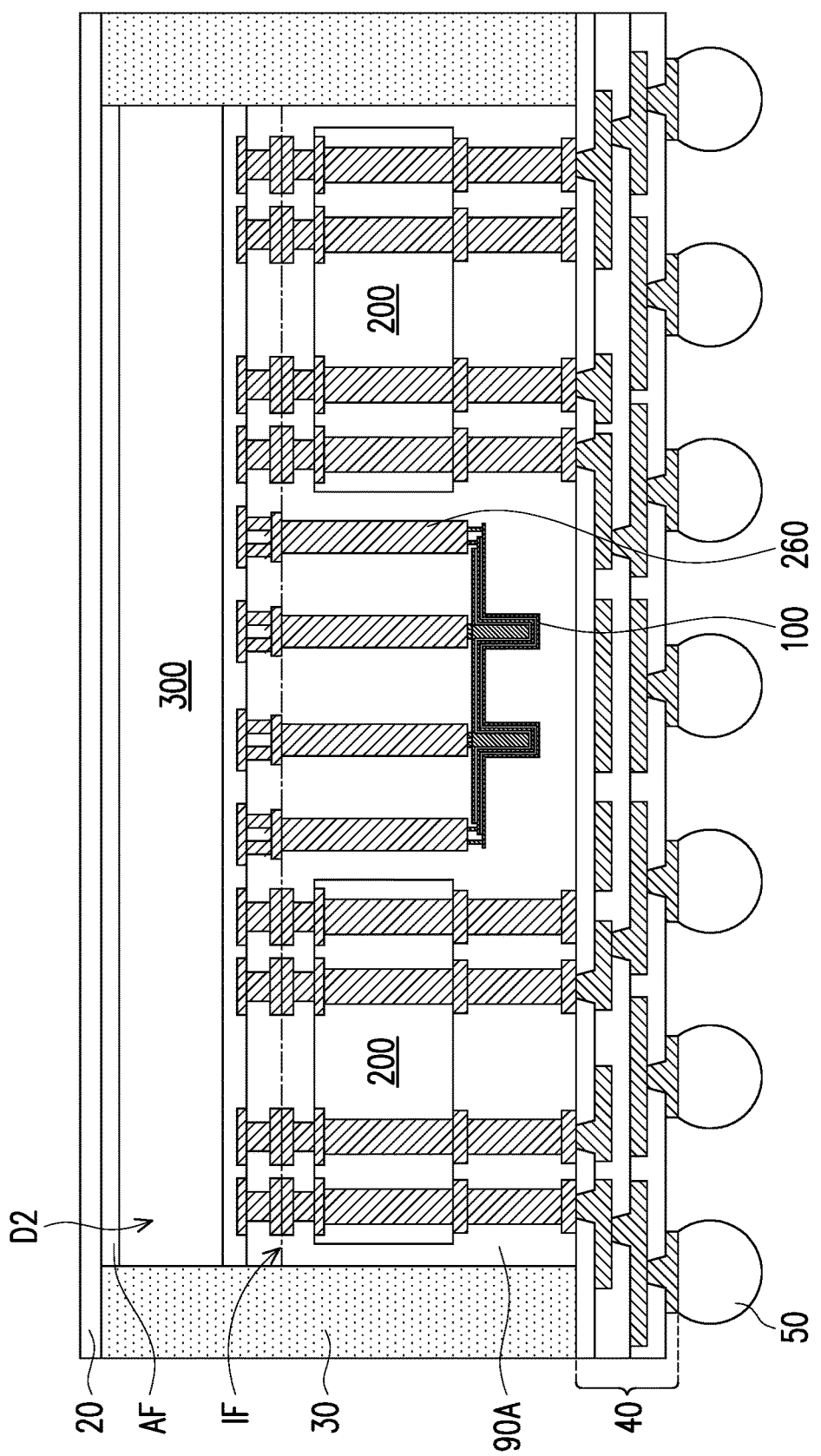

Referring to FIG. 3H and with reference to FIG. 3G, the singulation may be performed after the de-bonding of the temporary carrier TC3 so as to form a semiconductor package SP2. The de-bonding process of the temporary carrier TC3 and the singulation process may be similar to the processes described in FIG. 2G. The difference between the semiconductor package SP2 and the semiconductor package SP1 in FIG. 2G lies in the IC structure D2. As shown in FIG. 3H, the IC structure D2 includes the capacitor structure 100 coupled to the semiconductor die 300 through the TDVs 260. Moreover, the capacitor structure 100 is disposed at the same level as the conductive connectors 250, and the conductive connectors 250 are between the semiconductor dies 200 and the redistribution structure 40. That is, the semiconductor dies 200 and the capacitor structure 100 in the IC structure D2 are located at different levels of the dielectric layer 90A.

FIGS. 4A-4F are schematic cross-sectional views of various stages of manufacturing a semiconductor package in accordance with some embodiments. Unless specified otherwise, the materials and the formation methods of the components in these embodiments are essentially the same as the like components, which are denoted by like reference numerals in the embodiments shown in FIGS. 2A-2G and FIGS. 3A-3H. The details regarding the materials of the components may thus be found in the discussion of the embodiments shown in FIGS. 2A-2G and FIGS. 3A-3H.

Figure 4A:
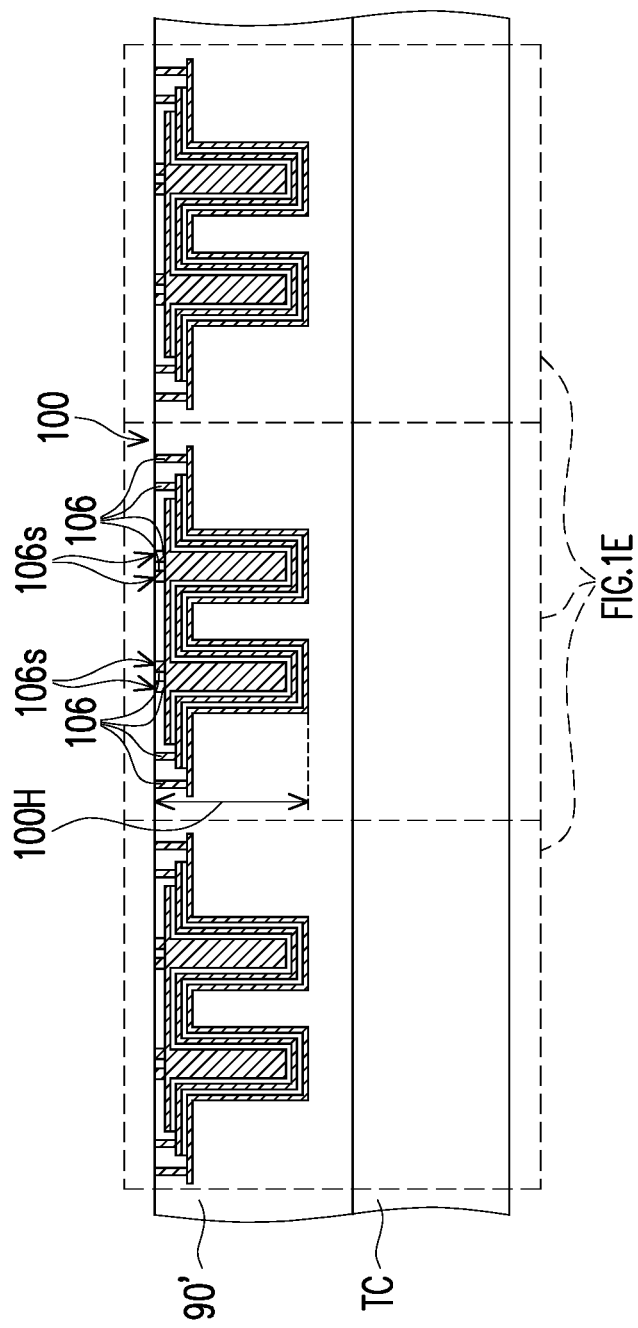
FIGS. 4A-4F are schematic cross-sectional views of various stages of manufacturing a semiconductor package in accordance with some embodiments.

Referring to FIG. 4A, a plurality of the capacitor structures 100 covered by the dielectric sublayer 90' may be formed over the temporary carrier TC. The respective capacitor structure 100 outlined in the dashed boxes may be the same as (or similar to) the structure shown in FIG. 1E, such that the detailed descriptions are not repeated for the sake of brevity. In some embodiments, the capacitor structures 100 are formed side by side and may be arranged in an array.

Figure 4B:
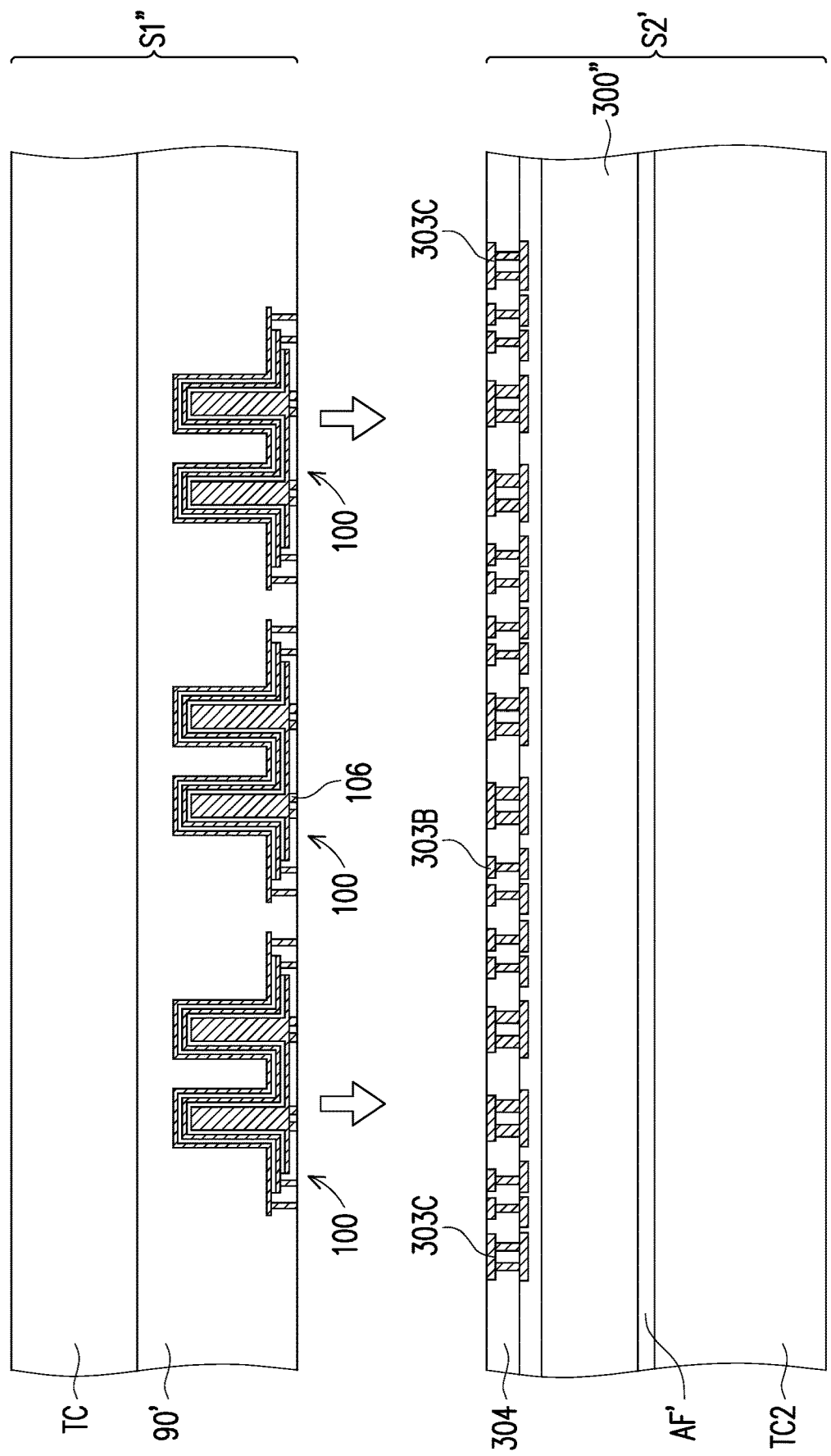

Referring to FIG. 4B and with reference to FIG. 4A, the structure shown in FIG. 4A may be prepared to be bonded to the semiconductor wafer 300". The semiconductor wafer 300" may be disposed over the temporary carrier TC2 with the attach film AF' interposed therebetween, where the lower structure S2' including the temporary carrier TC2, the attach film AF', and the semiconductor wafer 300" may be similar to the lower structure S2 shown in FIG. 2B such that the detailed descriptions are omitted for the sake of brevity. The difference between the semiconductor wafer 300" and 300' includes the configuration of the bonding features. For example, the semiconductor wafer 300" includes the bonding features 303C corresponding to the subsequently-formed via portions, where the bonding features 303C may be similar to the bonding features 303B or 303A. Before the bonding, the surface treatment followed by the cleaning may be performed on the structures including the electrode connectors 106 and the dielectric sublayer 90' of the upper structure S1" and the bonding features 303B and 303C and the bonding dielectric layer 304 of the lower structure S2'. The upper structure S1" and the lower structure S2' shown in FIG. 3C may be treated with the same surface treatment and/or cleaning process, or with different surface treatment and/or cleaning processes.

Figure 4C:
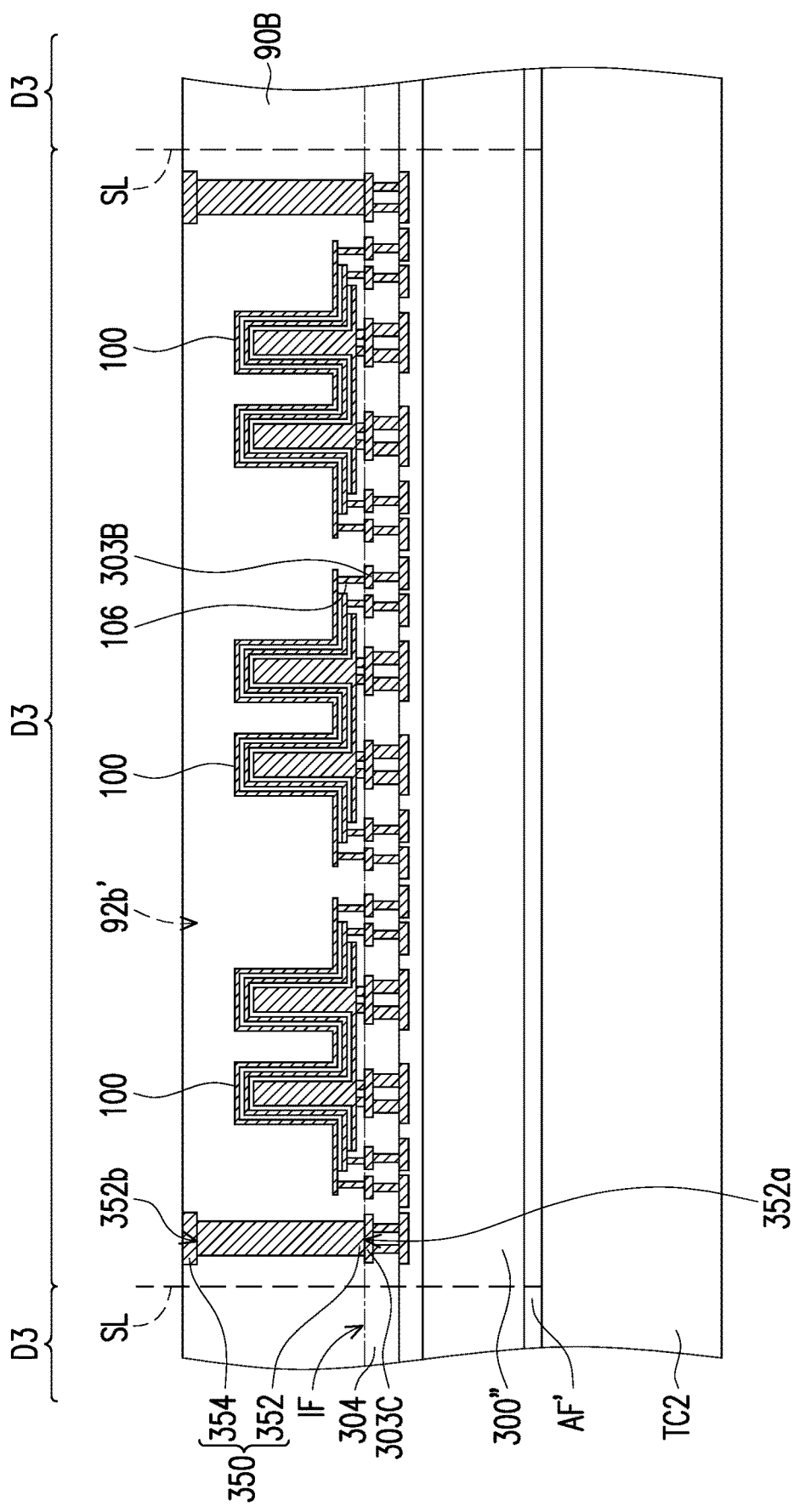

Referring to FIG. 4C and with reference to FIG. 4B, the upper structure S1" and the lower structure S2' shown in FIG. 4B may be bonded together. For example, the upper structure S1" is substantially aligned with the lower structure S2', and then the upper structure S1" and the lower structure S2' may be pressed against each other. The annealing process may be performed to strengthen the bonds of the structure. For example, after the bonding, the dielectric sublayer 90' is bonded to the bonding dielectric layer 304 of the semiconductor wafer 300", and the electrode connectors 106 are bonded to the bonding features 303B of the semiconductor wafer 300". It should be noted that the via-to-pad bonds are shown in FIG. 4C; however, the bonds may include the via-to-via bonds and/or the pad-to-pad bonds. The bonding interface IF of the bonded structure may include the metal-to-metal bonds, the dielectric-to-dielectric bonds, and metal-to-dielectric bonds.

With continued reference to FIG. 4C and FIG. 4B, the temporary carrier TC may be removed, and a plurality of via holes may be formed in the dielectric layer 90' to form a dielectric layer 90B including the via holes accessibly exposing bonding features 303C. Subsequently, conductive materials may be formed in the via holes to form a plurality of conductive connector 350. In some embodiments, the array of the capacitor structures 100 may be surrounded by the conductive connectors 350. In some embodiments, the conductive connectors 350 are formed by using damascene process or the like. The respective conductive connector 350 may include a via portion 352 formed on the corresponding bonding feature 303C and a pad portion 354 formed on the via portion 352. For example, the conductive connectors 350 including the via portions 352 and the pad portions 354 are laterally covered by the dielectric layer 90B. Next, the singulation may be performed to cut along the scribe lines SL to form a plurality of IC structures D3. For example, during the singulation, the dielectric layer 90B and the underlying semiconductor wafer 300" are cut to form the coterminous sidewall of the respective IC structure D3. In some embodiments, during the singulation, the attach film AF' is cut along with the overlying structure.

Figure 4D:
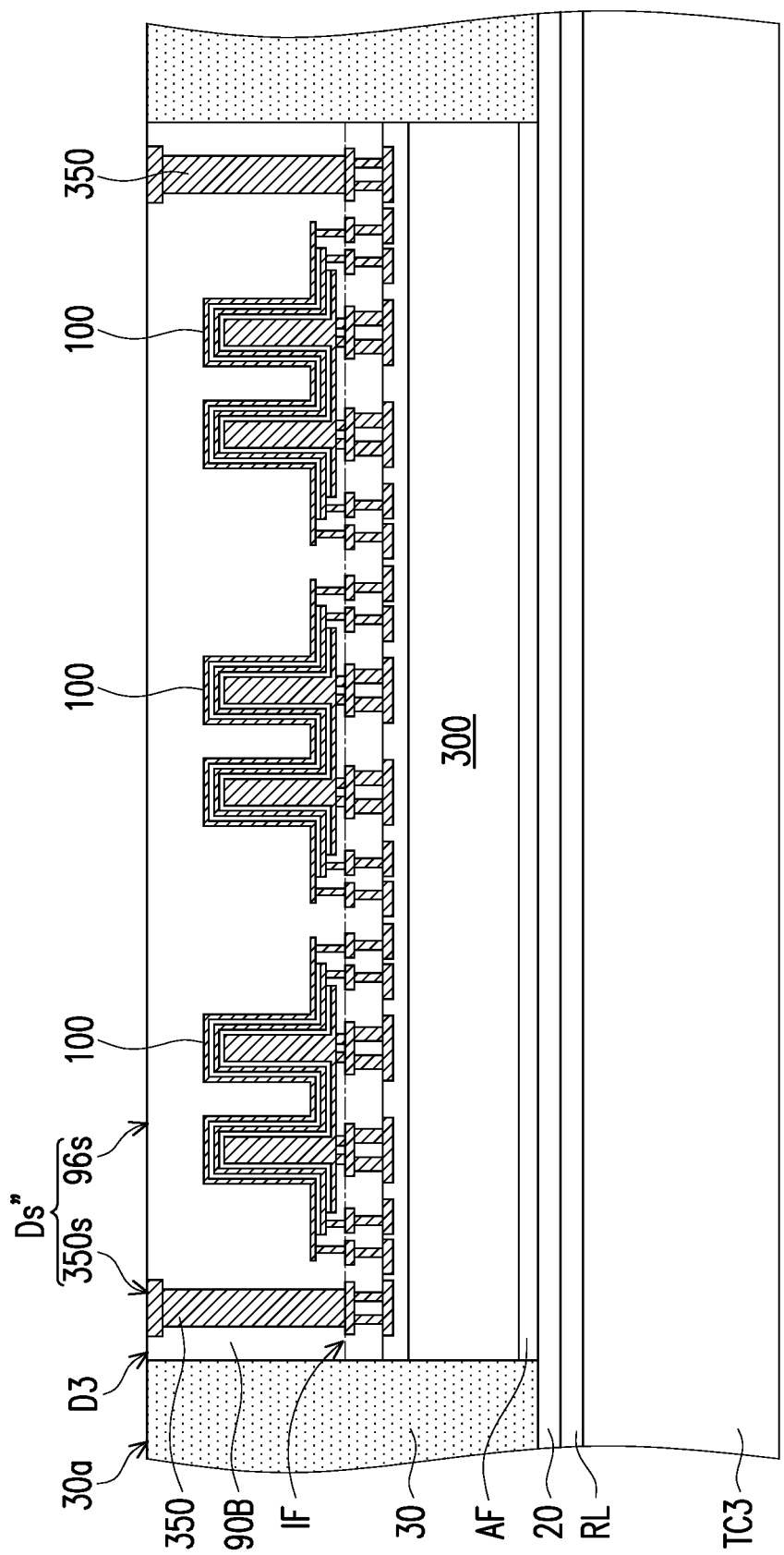

Referring to FIG. 4D and with reference to FIG. 4C, the IC structure D3 may be de-bonded from the temporary carrier TC2 and placed over the temporary carrier TC3 for packaging. The temporary carrier TC3 may be provided with the release layer RL, and the IC structure D3 may be disposed over the release layer RL. In some embodiments, the protection layer 20 may be formed prior to the placement of the IC structure D3, and the IC structure D2 may be attached to the protection layer 20 through the singulated attach film AF. Subsequently, the insulating encapsulation 30 may be formed over the protection layer 20 to laterally cover the IC structure D3 and the singulated attach film AF. The placement of the IC structure and the formation of the insulating encapsulation may be similar to the process described in FIGS. 2D-2E; therefore, the details thereof are omitted. In some embodiments, the surface 30a of the insulating encapsulation 30 is substantially leveled (e.g., coplanar) with the surface Ds" of the IC structure D3, where the surface Ds" includes the surfaces 350s of the conductive connectors 350 and the surface 96s of the dielectric layer 90B. The structure shown in FIG. 4D may be similar to the structure shown in FIG. 3F, except for the IC structure D3. Thus, the detailed descriptions are not repeated for the sake of brevity.

Figure 4E:
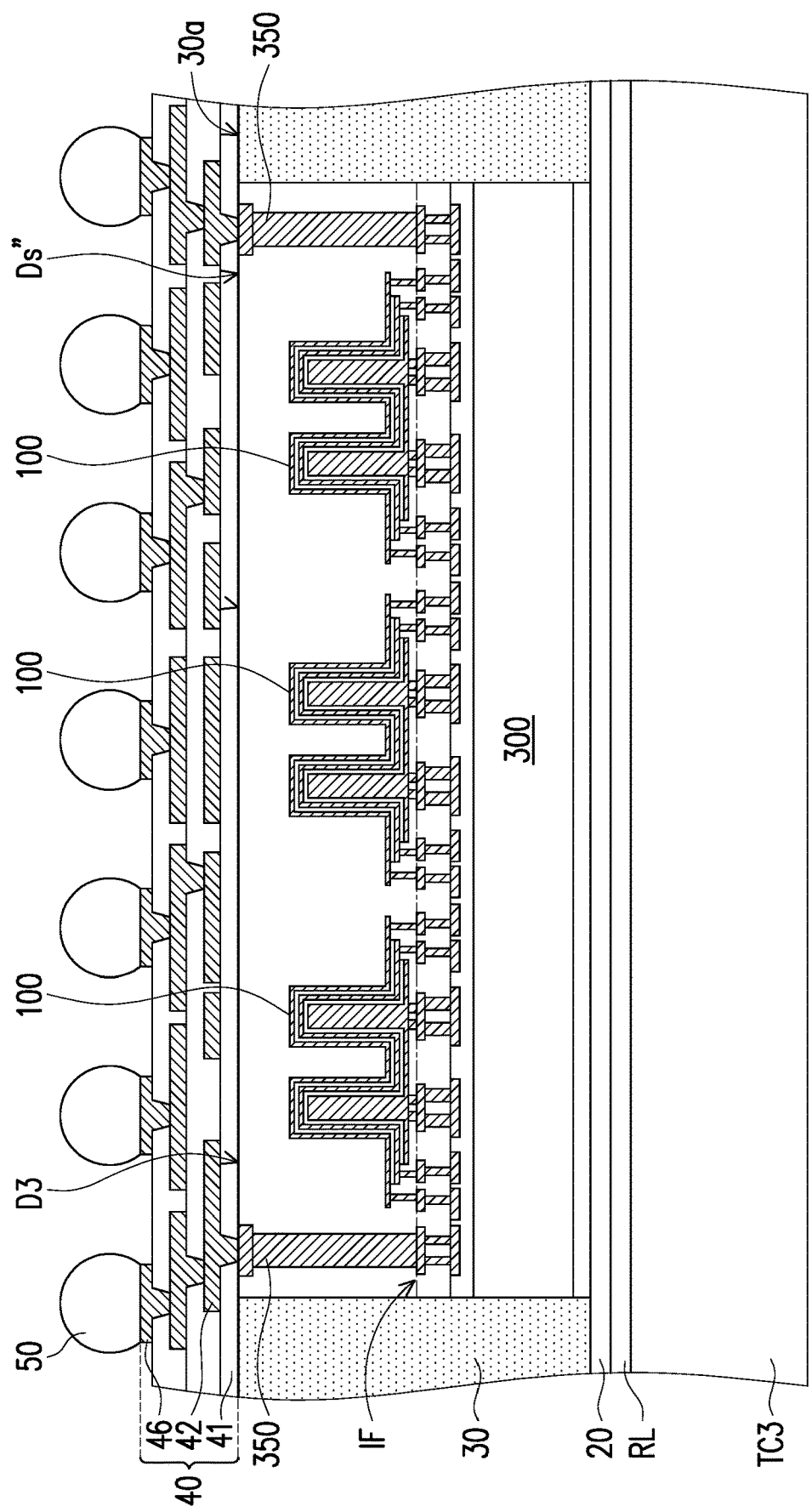

Referring to FIG. 4E, the redistribution structure 40 and the conductive terminals 50 may be sequentially formed over the IC structure D3 and the insulating encapsulation 30. The formation of the redistribution structure 40 may be similar to the process described in FIG. 2E, and the formation of the conductive terminals 50 may be similar to the process described in FIG. 2F. For example, the bottommost patterned dielectric layer 41 of the redistribution structure 40 is directly formed on the surface 30a of the insulating encapsulation 30 and the surface Ds" of the IC structure D3. The bottommost patterned conductive layer 42 may include conductive vias physically and electrically connected to the conductive connectors 350 of the IC structure D3. The conductive terminals 50 may be formed on the topmost patterned conductive layer 46 and may be electrically coupled to the IC structure D3 through the redistribution structure 40. The structure shown in FIG. 4E may be similar to the structure shown in FIG. 3G, except for the IC structure D3. Thus, the detailed descriptions are not repeated for the sake of brevity.

Figure 4F:
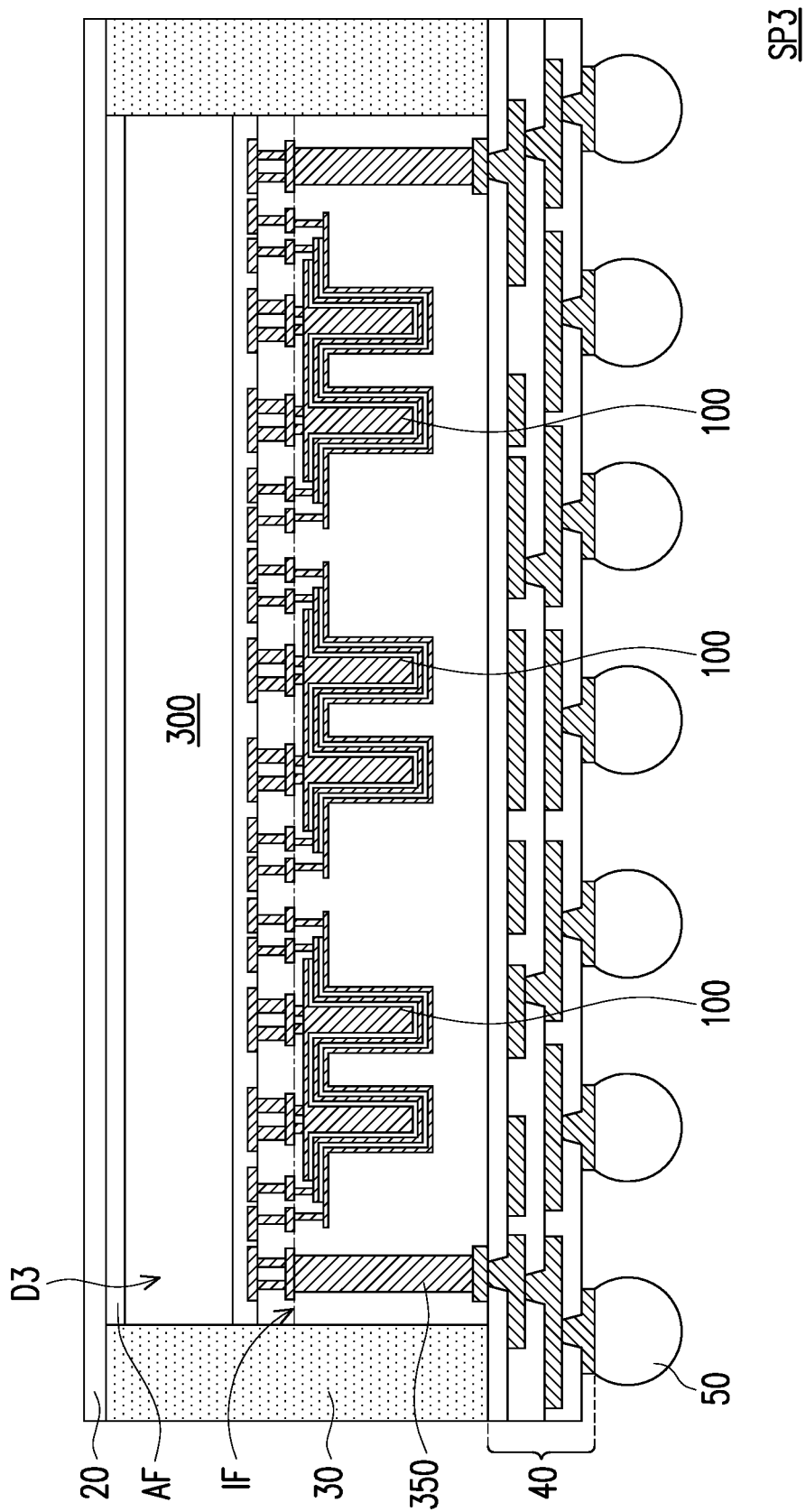

Referring to FIG. 4F and with reference to FIG. 4E, the singulation may be performed after the de-bonding of the temporary carrier TC3 so as to form a semiconductor package SP3. The de-bonding process of the temporary carrier TC3 and the singulation process may be similar to the processes described in FIG. 2G. The difference between the semiconductor package SP3 and the semiconductor package SP1 in FIG. 2G lies in the IC structure D3. As shown in FIG. 4F, the IC structure D3 includes multiple capacitor structures 100 disposed side by side and coupled to the semiconductor die 300. It is understood that several capacitor structures may be used to provide a very low impedance path when the capacitor structures 100 are connected across the semiconductor die 300. The conductive connectors 350 surrounding the capacitor structures 100 may provide vertical and electrical connections between the semiconductor die 300 to the redistribution structure 40. It should be understood that the IC structure D3 may further include the semiconductor die(s) 200 depending on product requirements.

Figure 5:
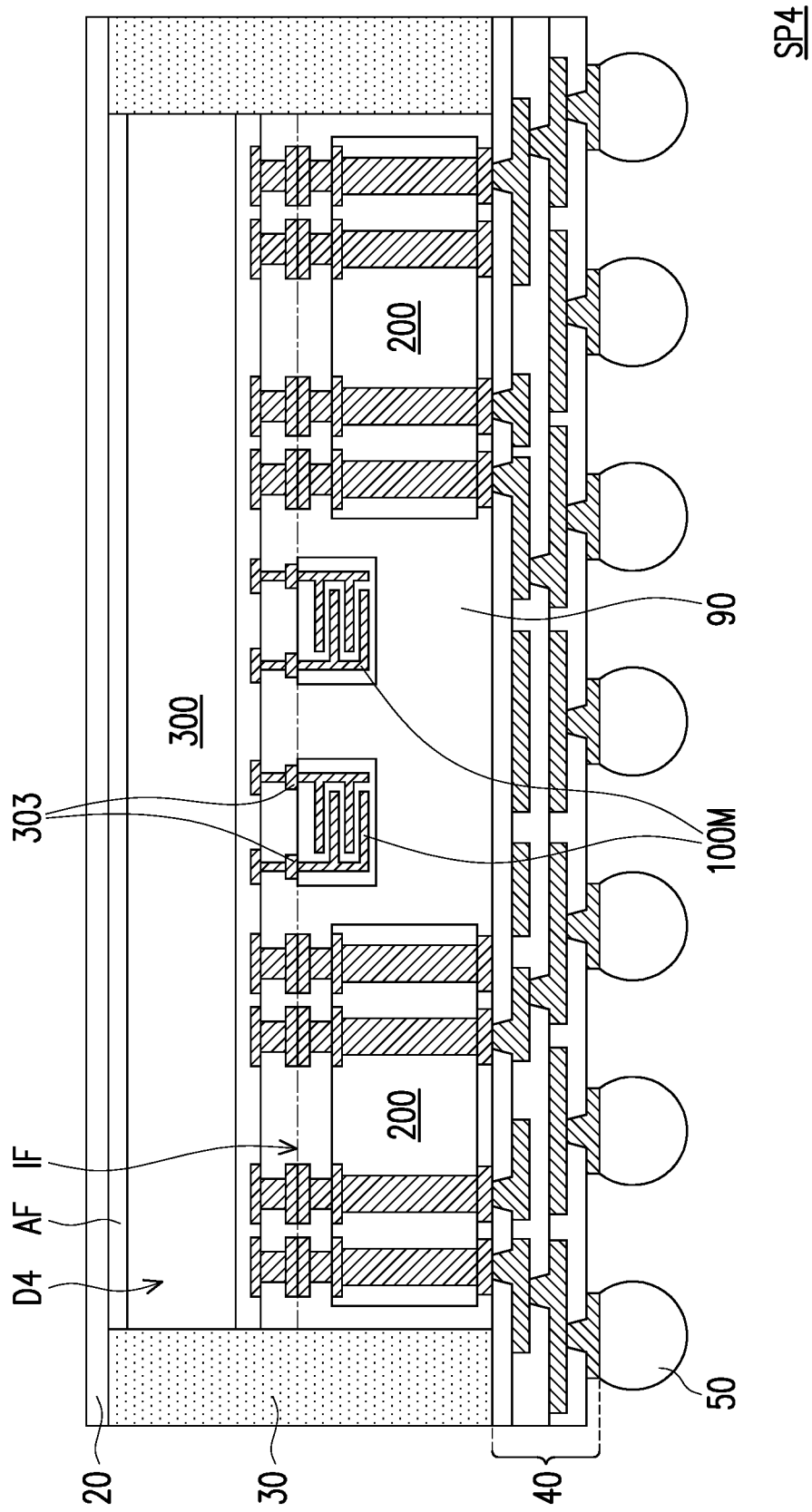
FIG. 5 is a schematic cross-sectional view a semiconductor package in accordance with some embodiments.

FIG. 5 is a schematic cross-sectional view a semiconductor package in accordance with some embodiments. Throughout the various views and illustrative embodiments, like reference numbers are used to designate like elements. Referring to FIG. 5 and with reference to FIG. 2G, a semiconductor package SP4 is similar to the semiconductor package SP1, except for the type of the capacitor structure 100M in the IC structure D4. In some embodiments, the capacitor structure 100M is a metal-insulator-metal (MIM) capacitor. For example, a plurality of the capacitor structures 100M is encapsulated by the dielectric layer 90 and located between two of the semiconductor dies 200. It should be noted that the capacitor structure 100M is illustrated in a simplified manner, and various layers and features are not individually labeled. Additionally, the number of the capacitor structures 100M shown herein is merely for illustrative purposes and is not limited. In some embodiments, the electrode layers of the capacitor structure 100M are physically and electrically connected to the bonding features 303 of the semiconductor die 300. The insulator layer of the capacitor structure 100M may include a polymer, a high k material, or other suitable dielectric material(s). The semiconductor package SP4 may be fabricated in the manner similar to the process described in FIGS. 2A-2G. In some embodiments, one or more the capacitor structure(s) 100 of the semiconductor package described elsewhere in the disclosure may be replaced with the capacitor structure 100M (e.g., MIM capacitor) for meeting customer demand.

Figure 6:
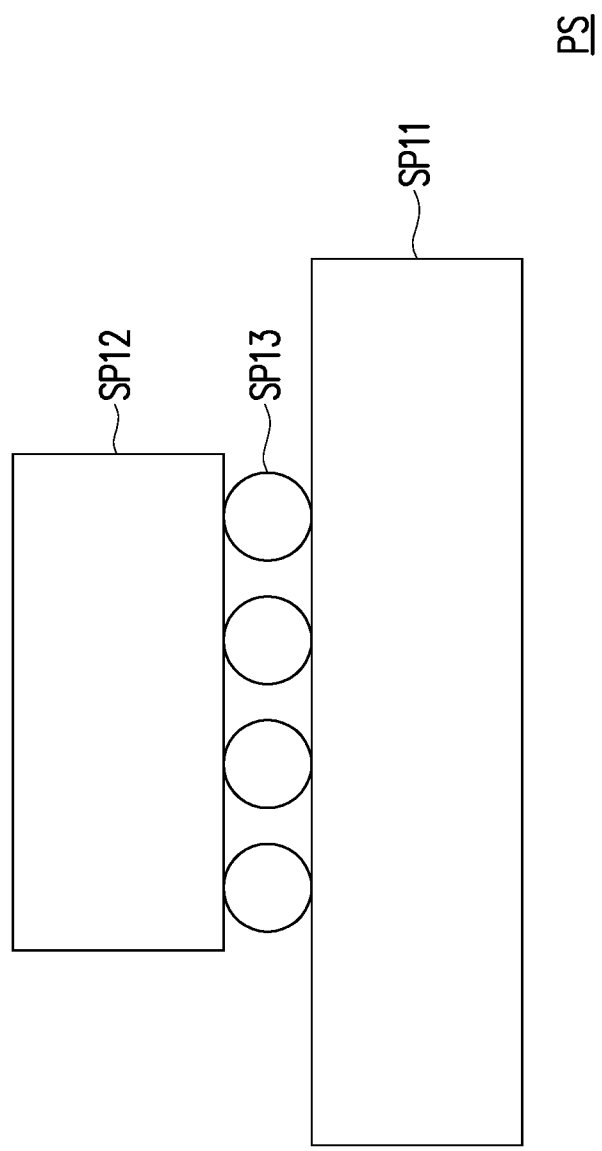
FIG. 6 is a schematic cross-sectional view a package structure in accordance with some embodiments.

FIG. 6 is a schematic cross-sectional view a package structure in accordance with some embodiments. Referring to FIG. 6, a package structure PS including a first package component SP11 and a second package component SP12 disposed over the first package component SP11 is provided. The first package component SP11 may be or may include an interposer, a package substrate, a printed wiring board, a printed circuit board (PCB), and/or other carrier that is capable of carrying integrated circuits. The second package component SP12 mounted on the first package component SP11 may be or may include logic die(s), memory die(s), the like, combinations of these, etc. The second package component SP12 may be similar to any one of the semiconductor packages described in FIGS. 2G, 3H, 4F, and 5. In some embodiments, more than one the semiconductor packages (e.g., any combination of the semiconductor packages described above) may be arranged side by side and electrically coupled to the first package component SP11 through a plurality of package terminals SP13. In some embodiments, the package terminals SP13 are the conductive terminals 50 described above. Alternatively, the package terminals SP13 are terminals (e.g., C4 bumps, solder balls, or BGA balls, etc.) having the sizes greater than the conductive terminals 50, and a reflow process may be performed on the package terminals SP13 to couple the second package component SP12 to the first package component SP11.

The semiconductor package described above may be an integrated fan-out package or may be a part of integrated fan-out package. For example, the IC structure described in the disclosure may be packaged to form other type(s) of the package (e.g., a chip-on-wafer-on-substrate package, a chip-on-wafer package, etc.) Other packaging techniques may be used to form the package structure PS. The package structure PS may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In accordance with some embodiments, a semiconductor package includes an integrated circuit (IC) structure, an insulating encapsulation laterally covering the IC structure, and a redistribution structure disposed on the insulating encapsulation and the IC structure. The redistribution structure is electrically connected to the IC structure. The IC structure includes a first die (i.e. the semiconductor die 200), a capacitor structure, a dielectric layer laterally covering the first die and the capacitor structure, and a second die (i.e. the semiconductor die 300) disposed on the dielectric layer, the first die, and the capacitor structure. The second die interacts with the capacitor structure, where a bonding interface between the second die and the first die is substantially coplanar with a bonding interface between the second die and the dielectric layer.

In accordance with some embodiments, a semiconductor package includes an integrated circuit (IC) structure, an insulating encapsulation laterally covering the IC structure, and a redistribution structure disposed on the insulating encapsulation and the IC structure. The redistribution structure is electrically connected to the IC structure. The IC structure includes a capacitor structure covered by a dielectric layer, and a semiconductor die bonded to the capacitor structure and the dielectric layer. A bonding interface between the semiconductor die and the capacitor structure is substantially coplanar with a bonding interface between the semiconductor die and the dielectric layer.

In accordance with some embodiments, a manufacturing method of a semiconductor package includes at least the following steps. An integrated circuit (IC) structure is formed, and an insulating encapsulation is formed to cover the IC structure. Forming the IC structure includes forming a capacitor structure in a dielectric layer, and bonding the capacitor structure and the dielectric layer to a first die, where bonding surfaces of electrode connectors of the capacitor structure are substantially leveled with a bonding surface of the dielectric layer, and the electrode connectors of the capacitor structure are bonded to first bonding features of the first die, and the dielectric layer is bonded to a bonding dielectric layer of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   an integrated circuit (IC) structure comprising:
      a first die and a capacitor structure;
      a dielectric layer laterally covering the first die and the capacitor structure, wherein the capacitor structure is fully buried in the dielectric layer; and
      a second die disposed on the dielectric layer, the first die, and the capacitor structure, the second die physically and electrically connected to the capacitor structure, wherein a bonding interface between the second die and the first die is substantially coplanar with a bonding interface between the second die and the dielectric layer, wherein a sidewall of the IC structure comprises a sidewall of the second die and a sidewall of the dielectric layer that are substantially aligned with each other;
   an insulating encapsulation laterally covering the IC structure; and
   a redistribution structure disposed under the insulating encapsulation and the IC structure, and the redistribution structure being electrically connected to the IC structure.

2. The semiconductor package of claim 1, wherein the capacitor structure is a deep-trench capacitor, and trench portions of the capacitor structure extend to be in proximity to the redistribution structure.

3. The semiconductor package of claim 1, wherein the first die and the capacitor structure are disposed side by side and separated from each other by the dielectric layer.

4. The semiconductor package of claim 3, wherein a bonding interface between the second die and the capacitor structure is substantially coplanar with the bonding interface between the second die and the first die.

5. The semiconductor package of claim 1, wherein:
   the dielectric layer of the IC structure comprises a first level connecting the second die, and a second level underlying the first level and connecting the redistribution structure, and
   the first die is embedded in the first level and the capacitor structure is embedded in the second level.

6. The semiconductor package of claim 5, wherein the IC structure further comprises:
   a through dielectric via disposed between and bonded to the first die and the capacitor structure, and the through dielectric via being disposed next to the second die.

7. The semiconductor package of claim 6, wherein a bonding interface between the through dielectric via and the first die is substantially coplanar with the bonding interface between the second die and the first die.

8. A semiconductor package, comprising:
   an integrated circuit (IC) structure comprising:
      a capacitor structure covered by a dielectric layer, wherein the capacitor structure is fully buried in the dielectric layer; and
      a semiconductor die bonded to the capacitor structure and the dielectric layer, wherein a bonding interface between the semiconductor die and the capacitor structure is substantially coplanar with a bonding interface between the semiconductor die and the dielectric layer, wherein a sidewall of the semiconductor die is substantially aligned with a sidewall of the dielectric layer;
   an insulating encapsulation laterally covering the IC structure; and
   a redistribution structure disposed under the insulating encapsulation and the IC structure, and the redistribution structure being electrically connected to the IC structure.

9. The semiconductor package of claim 8, wherein the capacitor structure is a deep-trench capacitor comprising an electrode side and a trench side, the electrode side is bonded to the semiconductor die, and the trench side extends toward the redistribution structure.

10. The semiconductor package of claim 8, wherein the IC structure further comprises:
    a conductive connector laterally covered by the dielectric layer and connecting the semiconductor die and the redistribution structure, wherein a bonding interface between the semiconductor die and the conductive connector is substantially coplanar with the bonding interface between the semiconductor die and the capacitor structure.

11. The semiconductor package of claim 10, wherein the capacitor structure is a metal-insulator-metal capacitor.

12. A manufacturing method of a semiconductor package, comprising:
    forming an integrated circuit (IC) structure comprising:
       forming a capacitor structure in a dielectric layer, wherein bonding surfaces of electrode connectors of the capacitor structure are substantially leveled with a bonding surface of the dielectric layer, and wherein the capacitor structure is fully buried in the dielectric layer;
       bonding the capacitor structure and the dielectric layer to a first die, wherein the electrode connectors of the capacitor structure are bonded to first bonding features of the first die, and the dielectric layer is bonded to a bonding dielectric layer of the first die, wherein a bonding interface between the first die and the capacitor structure is substantially coplanar with a bonding interface between the first die and the dielectric layer, and wherein a sidewall of the first die is substantially aligned with a sidewall of the dielectric layer;

forming an insulating encapsulation to cover the IC structure; and forming a redistribution structure on the insulating encapsulation and the IC structure, wherein the redistribution structure is electrically connected to the IC structure.

13. The manufacturing method of claim 12, wherein forming the IC structure further comprises:

performing a singulation process after the bonding to cut off the dielectric layer and the first die underlying the dielectric layer.

14. The manufacturing method of claim 12, wherein forming the IC structure further comprises:

covering a plurality of second dies with another dielectric layer;

bonding the second dies and the another dielectric layer to the first die.

15. The manufacturing method of claim 14, wherein covering the second dies with the another dielectric layer and forming the capacitor structure in the dielectric layer are separately fabricated.

16. The manufacturing method of claim 12, wherein forming the IC structure further comprises:

forming a conductive connector in another dielectric layer;

disposing a second die on the another dielectric layer and the conductive connector, wherein the second die is electrically connected to the conductive connector;

forming additional dielectric layer on the another dielectric layer to cover the second die.

17. The manufacturing method of claim 12, wherein forming the IC structure further comprises:

forming a conductive connector in the dielectric layer and next to the capacitor structure, wherein the conductive connector is connected to a second bonding feature of the first die.

18. The manufacturing method of claim 12, further comprising:

performing a singulation process to cut off the redistribution structure and the insulating encapsulation underlying the redistribution structure.

19. The manufacturing method of claim 12, wherein forming the capacitor structure comprises:

forming trenches in a first dielectric material layer;

alternately forming a plurality of conductive material layers and a plurality of dielectric material layers on the first dielectric material layer and inside the trenches;

patterning the plurality of conductive material layers and the plurality of dielectric material layers;

forming a second dielectric material layer over the first dielectric material layer to cover the plurality of conductive material layers and the plurality of dielectric material layers; and forming the electrode connectors in the second dielectric material layer to connect each of the plurality of conductive material layers.

20. The semiconductor package of claim 1, wherein the capacitor structure is a metal-insulator-metal capacitor.

* * * * *